United States Patent
Yook et al.

(10) Patent No.: US 12,258,503 B2
(45) Date of Patent: Mar. 25, 2025

(54) CURABLE SILICONE-(METH)ACRYLATE COMPOSITION AND METHODS FOR ITS PREPARATION AND USE

(71) Applicant: Dow Silicones Corporation, Midland, MI (US)

(72) Inventors: Juyoung Yook, Chungcheongbuk-do (KR); Yoonyoung Kim, Gwank-gu (KR)

(73) Assignee: Dow Silicones Corporation, Midland, MI (US)

( * ) Notice: Subject to any disclaimer, the term of this patent is extended or adjusted under 35 U.S.C. 154(b) by 267 days.

(21) Appl. No.: 18/001,485

(22) PCT Filed: Jul. 6, 2021

(86) PCT No.: PCT/US2021/040406
§ 371 (c)(1),
(2) Date: Dec. 12, 2022

(87) PCT Pub. No.: WO2022/066261
PCT Pub. Date: Mar. 31, 2022

(65) Prior Publication Data
US 2023/0227700 A1    Jul. 20, 2023

Related U.S. Application Data

(60) Provisional application No. 63/081,367, filed on Sep. 22, 2020.

(51) Int. Cl.
C09J 7/38       (2018.01)
C09J 5/00       (2006.01)
H01L 21/683     (2006.01)

(52) U.S. Cl.
CPC . C09J 7/38 (2018.01); C09J 5/00 (2013.01); H01L 21/6836 (2013.01); C09J 2203/326 (2013.01); C09J 2301/302 (2020.08); C09J 2301/416 (2020.08); C09J 2483/00 (2013.01)

(58) Field of Classification Search
CPC ... C09J 7/38; C09J 2203/318; C09J 2203/326
USPC .................................................. 156/275.7
See application file for complete search history.

(56) References Cited

U.S. PATENT DOCUMENTS

| | | |
|---|---|---|
| 2,676,182 A | 4/1954 | Daudt et al. |
| 2,823,218 A | 2/1958 | Speir et al. |
| 3,159,601 A | 12/1964 | Ashby et al. |
| 3,220,972 A | 11/1965 | Lamoreaux et al. |
| 3,284,406 A | 11/1966 | Nelson |
| 3,296,291 A | 1/1967 | Scotia et al. |
| 3,419,593 A | 12/1968 | Willing et al. |
| 3,516,946 A | 6/1970 | Scotia et al. |
| 3,814,730 A | 6/1974 | Karstedt et al. |
| 3,989,668 A | 11/1976 | Lee et al. |
| 4,329,273 A | 5/1982 | Hardman et al. |
| 4,370,358 A | 1/1983 | Hayes et al. |
| 4,503,208 A | 3/1985 | Lin et al. |
| 4,585,669 A | 4/1986 | Eckberg |
| 4,587,137 A | 5/1986 | Eckberg |
| 4,611,042 A | 9/1986 | Rivers-Farrell et al. |
| 4,707,531 A | 11/1987 | Shirahata |
| 4,766,176 A | 8/1988 | Lee et al. |
| 4,772,515 A | 9/1988 | Hara et al. |
| 4,774,310 A | 9/1988 | Butler |
| 4,784,879 A | 11/1988 | Lee et al. |
| 5,010,159 A | 4/1991 | Bank et al. |
| 5,017,654 A | 5/1991 | Togashi et al. |
| 5,036,117 A | 7/1991 | Chung et al. |
| 5,169,920 A | 12/1992 | Okawa |
| 5,175,325 A | 12/1992 | Brown et al. |
| 5,310,843 A | 5/1994 | Morita |
| 5,317,072 A | 5/1994 | Bokerman et al. |
| 5,516,858 A | 5/1996 | Morita et al. |
| 5,959,038 A | 9/1999 | Furukawa et al. |
| 5,982,041 A | 11/1999 | Mitani et al. |
| 6,281,285 B1 | 8/2001 | Becker et al. |
| 6,376,070 B1 | 4/2002 | Nakasuga et al. |
| 6,677,407 B1 | 1/2004 | Bilgrien et al. |
| 6,790,310 B2 | 9/2004 | Nakasuga et al. |
| 6,828,355 B1 | 12/2004 | Chu |
| 6,956,087 B2 | 10/2005 | Lai et al. |
| 8,377,634 B2 | 2/2013 | Albaugh et al. |
| 9,023,433 B2 | 5/2015 | Fu et al. |
| 9,475,968 B2 | 10/2016 | Hammond et al. |
| 9,593,209 B2 | 3/2017 | Dent et al. |
| 2004/0116547 A1 | 6/2004 | Bennington |
| 2019/0169478 A1 | 6/2019 | Kong et al. |

FOREIGN PATENT DOCUMENTS

| | | |
|---|---|---|
| EP | 0347895 | 11/1993 |
| JP | 2019085488 | 6/2019 |

OTHER PUBLICATIONS

Kobayashi Y., et al.,"English machine-translation by Clarivate Analytics of JP-2021167364-A with full JP patent application included", H10H20/85, Apr. 8, 2020. (Year: 2020).*
Espeel, "One-pot, additive-free preparation of functionalized polyurethanes via amine-thiol-ene conjugation", Polymer Chemistry, 2013, vol. 4, No. 8, pp. 2449-2456.
Su, "New Photocurable Acrylic/Silsesquioxane Hybrid Optical Materials: Synthesis, Properties, and Patterning", Macromolecular Materials and Engineering, 2007, vol. 292, Issue 5, pp. 666-673.

* cited by examiner

*Primary Examiner* — S. Behrooz Ghorishi
*Assistant Examiner* — Gregory C. Grosso
(74) *Attorney, Agent, or Firm* — Catherine U. Brown

(57) ABSTRACT

A curable silicone-(meth)acrylate pressure sensitive composition is curable via hydrosilylation reaction to form a silicone-(meth)acrylate pressure sensitive adhesive with an initial adhesion. When the silicone-(meth)acrylate pressure sensitive adhesive is exposed to actinic radiation, the resulting silicone-(meth)acrylate adhesive has a subsequent adhesion, which is higher than the initial adhesion.

12 Claims, No Drawings

CURABLE SILICONE-(METH)ACRYLATE COMPOSITION AND METHODS FOR ITS PREPARATION AND USE

CROSS REFERENCE TO RELATED APPLICATIONS

This application is a U.S. national stage filing under 35 U.S.C. § 371 of PCT Application No. PCT/US2021/040406 filed on 6 Jul. 2021. which claims the benefit of U.S. Provisional Patent Application No. 63/081,367 filed 22 Sep. 2020 under 35 U.S.C. § 119 (e). PCT Application No. PCT/US2021/040406 and U.S. Provisional Patent Application No. 63/081,367 are each hereby incorporated by reference.

TECHNICAL FIELD

This invention relates to a curable silicone-(meth)acrylate composition (composition) suitable for forming a silicone-(meth)acrylate pressure sensitive adhesive (PSA). More particularly, the present invention relates to a composition suitable for forming a PSA susceptible to actinic energy. The composition and PSA are useful in methods for (opto) electronic device fabrication.

BACKGROUND

Silicone compositions suitable for forming pressure sensitive adhesives have been previously reported. These silicone compositions typically contain at least two primary components, namely a linear siloxane polymer and a tackifier resin consisting essentially of triorganosiloxane units of formula $R_3SiO_{1/2}$, in which R denotes a monovalent hydrocarbon group, and silicate (Q) units of formula $SiO_{4/2}$. In addition to the above two components, these silicone compositions are generally provided with some crosslinking means in order to cure the silicone composition to produce the pressure sensitive adhesive.

Problem to be Solved

The conventional pressure sensitive adhesives described above generally have constant (or almost constant) adhesion strength after cure. Their adhesion strength is typically lower than that of regular (permanent) adhesives, and it is difficult to further develop the adhesive strength of a conventional pressure sensitive adhesive after curing the silicone composition described above. This leads a limitation on use of the conventional pressure sensitive adhesives in various applications.

For example, when fabricating an (opto)electric device, the relatively low adhesion strength of a pressure sensitive adhesive is desired for rework-ability during the fabrication process, and thereafter (at the end of the process) higher adhesion strength is desired for long-term, practical use of the device. And, in protective film applications for long term use of edge-curved displays, higher holding strength of an adhesive layer in the protective film (as compared with conventional pressure sensitive adhesives) is required for the edge-curved display because the conventional PSA may suffer from the drawback of delamination at the curved edge due to the recovery force of the rigid substrate used in the protective film. Furthermore, in some applications, sheet (or solid state) form adhesives are desired when it is difficult to use flowable liquid adhesives. Therefore, there is an industry need to provide a curable composition that can form a pressure sensitive adhesive with an adhesion increasing property, where increase in adhesion can be initiated when desired by exposure to a trigger, such as an actinic energy ray (e.g., a UV light).

SUMMARY

A curable silicone-(meth)acrylate pressure sensitive adhesive composition (composition) is suitable for forming a silicone-(meth)acrylate pressure sensitive adhesive (PSA). The composition and method for its preparation are provided. A method for the preparation and use of the PSA from the composition is also provided.

DETAILED DESCRIPTION

The composition described above comprises:
(A) a linear or substantially linear polydiorganosiloxane polymer having at least two aliphatically unsaturated hydrocarbon groups per molecule comprising unit formula $(R^4_3SiO_{1/2})_m(R^4_2R^3SiO_{1/2})_n(R^4_2SiO_{2/2})_o(R^4R^3SiO_{2/2})_p(R^4SiO_{3/2})_q(R^3SiO_{3/2})_r(SiO_{4/2})_s$, where each $R^4$ is an independently selected monovalent hydrocarbon group that is free of aliphatic unsaturation and each $R^3$ is an independently selected aliphatically unsaturated monovalent hydrocarbon group; subscripts m, n, o, p, q, r, and s represent numbers of each unit in the formula and have values such that $0 \le m$, $0 \le n$, a quantity $(m+n) \ge 2$; $0 < o < 10,000$, $p \ge 0$, a quantity $(o+p)$ is 100 to 10,000; $0 \le q \le 100$, $0 \le r \le 100$, and $0 \le s \le 100$; with the proviso that if any one or more of subscript q, r, or s is greater than 0, then a ratio $(o+p)/(q+r+s)$ is 50/1 to 10,000/1;
(B) a (meth)acryloxyalkyl-functional polyorganosiloxane resin comprising unit formula $(R^1_3SiO_{1/2})_a(R^1_2R^2SiO_{1/2})_b(R^1R^2SiO_{2/2})_c(R^1_2SiO_{2/2})_d(R^2SiO_{3/2})_e(R^1SiO_{3/2})_f(SiO_{4/2})_g(ZO_{1/2})_h$, where each $R^1$ is an independently selected monovalent hydrocarbon group, each R²is an independently selected (meth)acryloxyalkyl group, each Z is independently selected from the group consisting of hydrogen and an alkyl group of 1 to 6 carbon atoms; subscripts a, b, c, d, e, f, g, and h represent relative molar amounts of each unit and have values such that subscript $a \ge 0$, subscript $b \ge 0$, subscript $c \ge 0$, subscript $d \ge 0$, subscript $f \ge 0$, subscript $g \ge 0$, subscript $h \ge 0$, and a quantity $(a+b+c+d+e+f+g+h)=100$; with the provisos that $10 \ge (b+c+e) \ge 0.5$ and $99.5 > (f+g) \ge 30$; where starting materials (A) and (B) are present in the composition in amounts sufficient to provide a weight ratio of (B) resin/(A) polymer (resin/polymer ratio) of 0.15/1 to <22/1;
(C) a polyorganohydrogensiloxane comprising unit formula $(R^5_3SiO_{1/2})_t(R^5_2HSiO_{1/2})_u(R^5_2SiO_{2/2})_v(R^5HSiO_{2/2})_w(R^5SiO_{3/2})_x(HSiO_{3/2})_y(SiO_{4/2})_z$, where each $R^5$ is an independently selected monovalent hydrocarbon group, subscripts t, u, v, w, x, y, and z represent numbers of each unit in the formula and have values such that $t \ge 0$, $u \ge 0$, $v \ge 0$, $w \ge 0$, $x \ge 0$, $y \ge 0$, $z \ge 0$, a quantity $(u+w+y) \ge 2$, and $2,000 \ge (t+u+v+w+x+y+z) \ge 3$; where the polyorganohydrogensiloxane is present in an amount sufficient to provide a molar ratio of silicon bonded hydrogen atoms in starting material (C) to reactive groups (SiH/reactive group ratio) of 0.05/1 to 2/1, where the reactive groups are the aliphatically unsaturated monovalent hydrocarbon group in starting material (A) and the (meth)acryloxyalkyl groups in starting material (B), combined, (D) a hydrosilylation reaction catalyst in an amount sufficient to provide 1 ppm to 1,000 ppm of a platinum group metal based on combined weights of starting materials (A), (B), (C), (D), (E), and (F) in the composition;
(E) a photoradical initiator in an amount sufficient to provide 0.01% to 10% based on combined weights of starting materials (A), (B), (C), (D), (E), and (F) in the composition; and
(F) a hydrosilylation reaction inhibitor in an amount sufficient to provide 5 ppm to 2% based on combined weights of starting materials (A), (B), (C), (D), (E), and (F) in the composition;

The composition may optionally further comprise one or more additional starting materials selected from the group consisting of: (G) a radical scavenger, (H) a solvent, (I) a non-functional polyorganosilicate resin, and a combination of two or more of (G), (H), and (I).

(A) Polymer

Starting material (A) in the composition is a linear or substantially linear polydiorganosiloxane polymer having at least two aliphatically unsaturated hydrocarbon groups per molecule (polymer). Said polymer comprises unit formula $(R^4_3SiO_{1/2})_m(R^4_2R^3SiO_{1/2})_n(R^4_2SiO_{2/2})_o(R^4R^3SiO_{2/2})_p$ $(R^4SiO_{3/2})_q(R^3SiO_{3/2})_r(SiO_{4/2})_s$, where each $R^4$ is an independently selected monovalent hydrocarbon group that is free of aliphatic unsaturation and each $R^3$ is an independently selected aliphatically unsaturated monovalent hydrocarbon group; subscripts m, n, o, p, q, r, and s represent numbers of each unit in the formula and have values such that $0 \le m$, $0 \le n$, a quantity $(m+n) \ge 2$; $0 < o < 10,000$, $p \ge 0$, a quantity $(o+p)$ is 100 to 10,000; $0 \le q \le 100$, $0 \le r \le 100$, and $0 \le s \le 100$; with the proviso that if any one or more of subscript q, r, or s is greater than 0, then a ratio $(o+p)/(q+r+s)$ is 50/1 to 10,000/1. Alternatively, the polydiorganosiloxane may be free of T and/or Q units, e.g., when subscript q=0, subscript r=0, and subscript s=0. Alternatively, subscript m may be 0. Alternatively, subscript n may be 2. Alternatively, a quantity (n+o+p) may be sufficient to provide the polymer with an aliphatically unsaturated group content (e.g., vinyl content) of 0.01% to 0.5% based on weight of starting material (A).

Examples of suitable aliphatically unsaturated monovalent hydrocarbon groups for $R^3$ include alkenyl groups and alkynyl groups. Examples of suitable alkenyl groups include vinyl, allyl, and hexenyl. Examples of suitable alkynyl groups include ethynyl and propynyl. Alternatively, each $R^3$ may be an independently selected alkenyl group. Alternatively, each $R^3$ may be selected from the group consisting of vinyl and hexenyl. Alternatively, each $R^3$ may be vinyl.

The monovalent hydrocarbon group for $R^4$ may be an alkyl group or an aryl group. Suitable alkyl groups are exemplified by, but not limited to, methyl, ethyl, propyl (e.g., iso-propyl and/or n-propyl), butyl (e.g., isobutyl, n-butyl, tert-butyl, and/or sec-butyl), pentyl (e.g., isopentyl, neopentyl, and/or tert-pentyl), hexyl, as well as branched saturated hydrocarbon groups of 6 carbon atoms. Alternatively, the alkyl group may be methyl, ethyl or propyl. Suitable aryl groups are exemplified by, but not limited to, phenyl, tolyl, xylyl, benzyl, and 2-phenylethyl. Alternatively, each $R^4$ may be a methyl group or a phenyl group. Alternatively, each $R^4$ may be methyl.

Starting material (A) may comprise an alkenyl-functional polydiorganosiloxane such as i) bis-dimethylvinylsiloxy-terminated polydimethylsiloxane,
ii) bis-dimethylvinylsiloxy-terminated poly(dimethylsiloxane/methylvinylsiloxane),
iii) bis-dimethylvinylsiloxy-terminated polymethylvinylsiloxane,
iv) bis-trimethylsiloxy-terminated poly(dimethylsiloxane/methylvinylsiloxane),
v) bis-trimethylsiloxy-terminated polymethylvinylsiloxane,
vi) bis-dimethylvinylsiloxy-terminated poly(methylphenylsiloxane/methylvinylsiloxane),
vii) bis-dimethylvinylsiloxy-terminated poly(dimethylsiloxane/methylphenylsiloxane),
viii) bis-dimethylvinylsiloxy-terminated poly(dimethylsiloxane/diphenylsiloxane),
ix) bis-phenyl,methyl,vinyl-siloxy-terminated polydimethylsiloxane,
x) bis-dimethylhexenylsiloxy-terminated polydimethylsiloxane,
xi) bis-dimethylhexenylsiloxy-terminated poly(dimethylsiloxane/methylhexenylsiloxane),
xii) bis-dimethylhexenylsiloxy-terminated polymethylhexenylsiloxane,
xiii) bis-trimethylsiloxy-terminated poly(dimethylsiloxane/methylhexenylsiloxane),
xiv) bis-trimethylsiloxy-terminated polymethylhexenylsiloxane,
xv) bis-dimethylhexenyl-siloxy terminated poly(methylphenylsiloxane/methylhexenylsiloxane),
xvi) bis-dimethylvinylsiloxy-terminated poly(dimethylsiloxane/methylhexenylsiloxane),
xvii) bis-dimethylhexenyl-siloxy-terminated poly(dimethylsiloxane/methylphenylsiloxane),
xviii) dimethylhexenyl-siloxy-terminated poly(dimethylsiloxane/diphenylsiloxane), and
xix) a combination of two or more of i) to xviii).

Methods of preparing linear alkenyl-functional polydiorganosiloxanes described above for starting material (A), such as hydrolysis and condensation of the corresponding organohalosilanes and oligomers or equilibration of cyclic polydiorganosiloxanes, are known in the art, see for example U.S. Pat. Nos. 3,284,406; 4,772,515; 5,169,920; 5,317,072; and 6,956,087, which disclose preparing linear polydiorganosiloxanes with alkenyl groups. Examples of linear polydiorganosiloxanes having alkenyl groups are commercially available from, e.g., Gelest Inc. of Morrisville, Pennsylvania, USA under the tradenames DMS-V00, DMS-V03, DMS-V05, DMS-V21, DMS-V22, DMS-V25, DMS-V-31, DMS-V33, DMS-V34, DMS-V35, DMS-V41, DMS-V42, DMS-V43, DMS-V46, DMS-V51, DMS-V52.

(B) Resin

Starting material (B) in the composition described herein is a (meth)acryloxyalkyl-functional polyorganosiloxane resin comprising unit formula: $(R^1_3SiO_{1/2})_a(R^1_2R^2SiO_{1/2})_b$ $(R^1R^2SiO_{2/2})_c(R^1_2SiO_{2/2})_d(R^2SiO_{3/2})_e(R^1SiO_{3/2})_f(SiO_{4/2})_g$ $(ZO_{1/2})_h$, where each $R^1$ is an independently selected monovalent hydrocarbon group, each R$^2$ is an independently selected (meth)acryloxyalkyl group, each Z is independently selected from the group consisting of hydrogen and an alkyl group of 1 to 6 carbon atoms; subscripts a, b, c, d, e, f, g, and h represent relative molar amounts of each unit and have values such that subscript $a \ge 0$, subscript $b \ge 0$, subscript $c \ge 0$, subscript $d \ge 0$, subscript $e \ge 0$, subscript $f \ge 0$, subscript $g \ge 0$, subscript $h \ge 0$, and a quantity $(a+b+c+d+e+f+g)=100$; with the provisos that $10 \geq (b+c+e) \geq 0.5$ and $99.5 > (e+f+g) \geq 30$. Alternatively, a quantity (c+d) may be 0 to 20. Alternatively, (e+f+g) may be 30 to 90. Alternatively, subscript a may be 35 to 55. Alternatively, subscript b may be 0. Alternatively, subscript c may be 1 to 10. Alternatively, subscript d may be 0 to 20. Alternatively, subscript e may be 0 to 5. Alternatively, subscript f may be 0 to 3. Alternatively, subscript g may be 35 to 50. Subscript h is not included in the relative molar ratio, and subscript h may be 0 to a value sufficient to provide up to 5 mol % of hydroxyl and/or alkoxy groups to the resin. Alternatively, subscript h may be 0 to 5, alternatively 0 to 1, and alternatively 0 to 0.5.

Alternatively, the quantity (b+c+e) may be 0.5 to 8. Without wishing to be bound by theory, it is thought that over 8 mole % of units containing (meth)acryl-functional groups may cause poor compatibility with (A) the polymer, which may result in phase separation after preparation of a PSA from the composition. And, without wishing to be bound by theory, it is thought that less than 0.5 mole % of units containing (meth)acryl-functional groups may not be sufficient to effectively react by actinic energy such as a (UV) light to cause the desired adhesion increase.

Suitable monovalent hydrocarbon groups for $R^1$ in the unit formula above include aliphatically saturated monovalent hydrocarbon groups. Suitable aliphatically saturated monovalent hydrocarbon groups includes alkyl groups and aryl groups. The alkyl group may be branched, unbranched, or cyclic. Examples of alkyl groups include methyl, ethyl, propyl (including n-propyl and/or iso-propyl), butyl (including iso-butyl, n-butyl, tert-butyl, and/or sec-butyl), pentyl (including, iso-pentyl, neopentyl, and/or tert-pentyl); and hexyl, heptyl, octyl, nonyl, and decyl, as well as branched saturated monovalent hydrocarbon groups of 6 or more carbon atoms; and cyclic alkyl groups such as cyclopentyl or cyclohexyl. Alkyl groups have at least one carbon atom. Alternatively, alkyl groups may have 1 to 12 carbon atoms, alternatively 1 to 10 carbon atoms, alternatively 1 to 6 carbon atoms, alternatively 1 to 4 carbon atoms, alternatively 1 to 2 carbon atoms, and alternatively 1 carbon atom. Alternatively, the monovalent hydrocarbon groups for $R^1$ may be as described above for $R^4$. Alternatively, each $R^1$ may be alkyl, and alternatively methyl.

The aryl group for $R^1$ includes, alternatively is, a hydrocarbon group derived from an arene by removal of a hydrogen atom from a ring carbon atom. Aryl is exemplified by, but not limited to, phenyl, naphthyl, benzyl, tolyl, xylyl, phenylethyl, phenyl propyl, and phenyl butyl. Aryl groups have at least 5 carbon atoms. Monocyclic aryl groups may have 5 to 12 carbon atoms, alternatively 6 to 9 carbon atoms, and alternatively 6 carbon atoms. Polycyclic aryl groups may have 9 to 17 carbon atoms, alternatively 9 to 14 carbon atoms, and alternatively 9 to 12 carbon atoms.

Alternatively, for $R^1$, the alkyl group may be methyl and the aryl group may be phenyl. Alternatively, each $R^1$ may be independently selected from the group consisting of alkyl and aryl. Alternatively, (B) the resin, may contain 70 mol % or greater, alternatively 90 mol % or greater, of the total $R^1$; and alternatively each $R^1$ may be methyl.

Suitable (meth)acryloxyalkyl groups for $R^2$ are exemplified by methacryloxypropyl and acryloxypropyl.

Alternatively, (B) the polyorganosilicate resin may comprise a unit formula selected from the group consisting of $(R^1_3SiO_{1/2})_a(R^2R^1_2SiO_{1/2})_b(SiO_{4/2})_g(ZO_{1/2})_h$, $(R^1_3SiO_{1/2})_a(R^1R^2SiO_{2/2})_d(SiO_{4/2})_g(ZO_{1/2})_h$, $(R^1_3SiO_{1/2})_a(R^1SiO_{3/2})_e(SiO_{4/2})_g(ZO_{1/2})_h$, $(R^1_3SiO_{1/2})_a(R^2R^1_2SiO_{1/2})_b(R^1_2SiO_{2/2})_e(SiO_{4/2})_g(ZO_{1/2})_h$, $(R^1_3SiO_{1/2})_a(R^1_2SiO_{2/2})_e(R^1R^2SiO_{2/2})_d(SiO_{4/2})_g(ZO_{1/2})_h$, $(R^1_3SiO_{1/2})_a(R^1SiO_{3/2})_e(SiO_{4/2})_g(ZO_{1/2})_h$, $(R^1_3SiO_{1/2})_a(R^2R^1_2SiO_{1/2})_b(R^1R^2SiO_{2/2})_d(SiO_{4/2})_g(ZO_{1/2})_h$, $(R^1_3SiO_{1/2})_a(R^1R^2SiO_{2/2})_d(R^1SiO_{3/2})_e(SiO_{4/2})_g(ZO_{1/2})_h$, $(R^1_3SiO_{1/2})_a(R^2R^1_2SiO_{1/2})_b(R^1SiO_{3/2})_e(SiO_{4/2})_g(ZO_{1/2})_h$, $(R^1_3SiO_{1/2})_a(R^1R^2SiO_{2/2})_d(R^1SiO_{3/2})_e(SiO_{4/2})_g(ZO_{1/2})_h$, $(R^1_3SiO_{1/2})_a(R^2R^1_2SiO_{1/2})_b(R^2SiO_{3/2})_f(ZO_{1/2})_h$, $(R^1_3SiO_{1/2})_a(R^1R^2SiO_{2/2})_d(SiO_{4/2})_g(ZO_{1/2})_h$, $(R^1_3SiO_{1/2})_a(R^2SiO_{3/2})_f(R^1SiO_{3/2})_e(ZO_{1/2})_h$, $(R^1_3SiO_{1/2})_a(R^2R^1_2SiO_{1/2})_b(R^1_2SiO_{2/2})_e(R^2SiO_{3/2})_f(ZO_{1/2})_h$, $(R^1_3SiO_{1/2})_a(R^1_2SiO_{2/2})_e(R^1R^2SiO_{2/2})_d(R^2SiO_{3/2})_f(ZO_{1/2})_h$, $(R^1_3SiO_{1/2})_a(R^2SiO_{3/2})_f(R^1SiO_{3/2})_e(ZO_{1/2})_h$, $(R^1_3SiO_{1/2})_a(R^1_2SiO_{2/2})_e(R^2SiO_{3/2})_f(R^1SiO_{3/2})_e(ZO_{1/2})_h$, $(R^1_3SiO_{1/2})_a(R^2R^1_2SiO_{1/2})_b(R^1R^2SiO_{2/2})_d(R^2SiO_{3/2})_f(ZO_{1/2})_h$, $(R^1_3SiO_{1/2})_a(R^2R^1_2SiO_{1/2})_b(R^2SiO_{3/2})_f(R^1SiO_{3/2})_e(ZO_{1/2})_h$, and $(R^1_3SiO_{1/2})_a(R^1R^2SiO_{2/2})_d(R^2SiO_{3/2})_f(R^1SiO_{3/2})_e(ZO_{1/2})_h$, where subscripts a, b, c, d, e, f, g, and h are as described above. Alternatively, the quantity (b+d+e) is 1 to a number sufficient to provide up to 8 mole % of units containing (meth)acryl-functional groups, i.e., M' units of formula $(R^2R^1_2SiO_{1/2})$, D' units of formula $(R^1R^2SiO_{2/2})$, and/or T' units of formula $(R^2SiO_{3/2})$; to the resin. Alternatively, the quantity (b+d+e) may be 2 to a number sufficient to provide up to 8 mole % of M', D', and T' units combined to the resin. Alternatively, the quantity (b+d) may be 2 to a number sufficient to provide up to 8 mole % of M' and D' combined when e=0. Alternatively, the quantity d may be 2 to a number sufficient to provide up to 8 mole % of D' units to the resin when b=0 and e=0.

Without wishing to be bound by theory, it is thought that methyl groups are non-reactive and likely to afford wettability on the surface of an adherend as well as stability (e.g., no or minimal thermal shrinkage or degradation) after thermal treatment of the composition and exposure of the PSA to heat (e.g., after exposure to temperatures up to 200° C.) during (opto)electronic device fabrication processes.

The intermediates used to prepare (B) the resin may have two, three or four hydrolyzable substituents per molecule, e.g., they may be diorganoalkoxysilanes, triorganoalkoxysilanes and silanes with four hydrolyzable substituents or alkali metal silicates. The intermediates may have formulae $R^M_2SiX^1_2$, $RMSiX^1_3$, $SiX^1_4$ respectively, where $R^M$ is selected from the group consisting of $R^1$ and $R^2$, described above, and $X^1$ represents a hydrolyzable substituent. Silanes with four hydrolyzable substituents may have formula $SiX^2_4$, where each $X^2$ is halogen, alkoxy or hydroxyl. Suitable alkali metal silicates include sodium silicate.

Methods for the preparation of (meth)acryloxyalkyl-functional polyorganosiloxane resin containing M', D' and T' units above suitable for use as starting material (B), such as equilibration reaction of typical polyorganosiloxane resins reacting with a (meth)acryloxyalkyl-functional alkoxysilane or halosilane under acidic or basic conditions; such as a capping method and such as a hydrolytic hydrolysis/condensation reaction following co-hydrolysis of typical organohalosilanes or organoalkoxysilanes with a (meth)acryloxylalkyl-functional alkoxysilane or halosilane; and such as non-hydrolytic condensation reaction of typical organohalosilanes or organoalkoxysilanes with (meth)acryloxyalkyl-functional alkoxysilane or halosilane, will be known to those skilled in the art as similar methods for the preparation of polyorganosiloxane resin were described in U.S. Pat. No. 8,377,634 to Albaugh, U.S. Pat. No. 5,516,858 to Morita et al, U.S. Pat. No. 9,023,433 to Fu et al, U.S. Pat. No. 6,281,285 to Becker et al, U.S. Pat. No. 5,010,159 to Bank et al, U.S. Pat. No. 2,676,182 to Daudt, et al, U.S. Pat. No. 4,611,042 to Rivers-Farrell et al, and U.S. Pat. No. 4,774,310 to Butler, et al.

The (meth)acryloxyalkyl-functional alkoxysilane or halosilane used in the method for preparing (B) the resin, described above, can be selected from 3-(chlorodimethylsilyl)propyl methacrylate (CAS #24636-31-5), 3-[dimethoxy(methyl)silyl]propyl methacrylate (CAS #14513-34-9), methacryloxypropylmethyldichlorosilane (CAS #18301-56-9), (3-acryloxypropyl)methyldichlorosilane (CAS #71550-63-5), 3-[dimethoxy(methypsilyl]propyl acrylate (CAS #13732-00-8), 3-(trimethoxysilyl)propyl acrylate (CAS #4369-14-6), 3-[diethoxy(methypsilyl]propyl Methacrylate (CAS #65100-04-1), 3-(trimethoxysilyl)propyl Methacrylate (CAS #2530-85-0), 3-(triethoxysilyl)propyl methacrylate (CAS #21142-29-0), methacryloxypropyltrichlorosilane (CAS #7351-61-3), (3-acryloxylpropyl)trichlorosilane (CAS #38595-89-0).

Another method for preparing the resin containing M' units suitable for use as starting material (B), is hydrosilylation reaction between hydrosilyl (—SiH) functional polyorganosiloxane resin and (meth)acryl functional alkene or alkyne; or between alkenyl functional polyorganosiloxane resin and (meth)acryl functional hydrosilane, as descried in U.S. Pat. No. 4,503,208 to Lin et al, "Macromolecular Materials and Engineering" by Hung-Wen et al, Vol. 292, Issue 5, page 666-673 (2007). (Meth)acryl functional alkene or alkyne can be selected from allyl methacrylate (CAS #96-05-9) and propargyl acrylate (CAS #10477-47-1). The (meth)acryl functional hydrosilane for use in the hydrosilylation reaction can be selected from methacryloxypropyltris(dimethylsiloxy)silane (CAS #17096-08-1) and 2-propenoic acid, 2-methyl-3-(1,1,3,3-tetramethyldisiloxanyl)propyl-ester (CAS #96474-12-3).

The resin prepared as described above may contain silicon bonded hydroxyl groups, i.e., of formulae, $XSi_{3/2}$, $XR^M_2SiO_{2/2}$, and/or $XR^M_2SiO_{1/2}$, where X is hydroxyl group or alkoxy group. The resin may comprise up to 5% of silicon bonded hydroxyl group or alkoxy groups. The concentration of silicon bonded hydroxyl groups or alkoxy groups present in the polyorganosiloxane resin may be determined using Fourier Transform-Infra Red (FTIR) spectroscopy according to ASTM Standard E-168-16. For certain applications, it may desirable for the amount of silicon bonded hydroxyl groups to be 2% or less, alternatively below 0.7%, alternatively below 0.3%, alternatively below 1%, and alternatively 0.3% to 0.8%. Silicon bonded hydroxyl groups formed during preparation of the resin can be converted to triorgano (e.g., trihydrocarbyl) siloxane groups or to a different hydrolyzable group by reacting the resin with a silane, disiloxane, or disilazane containing the appropriate terminal group. Silanes containing hydrolyzable groups may be added in molar excess of the quantity required to react with the silicon bonded hydroxyl groups on the polyorganosilicate resin.

The Mn of (B) the resin depends on various factors including the types of hydrocarbyl groups represented by $R^M$ that are present. The Mn of the resin refers to the number average molecular weight measured using gel permeation chromatography (GPC) according to the procedure in U.S. Pat. No. 9,593,209 at col. 31, Reference Example 1, when the peak representing the neopentamer is excluded from the measurement. The Mn of the resin may be 500 g/mol to 5,000 g/mol. Alternatively, the Mn of the resin may be 1,000 g/mol to 4,000 g/mol.

When prepared, the resin comprises the units described above, and the resin further comprises the units with silanol or alkoxysilane (silicon bonded hydroxyl or alkoxy) groups and may comprise low molecular weight molecules, for example, neopentamer of formula $Si(OSiR^M_3)_4$, where $R^M$ is as described above, having the Mn of low molecular weight molecules less than 500 g/mol and its portion less than 25% when characterized by gel permeation chromatography (GPC) method. By adopting the characterization method that $Si^{29}$ Nuclear Magnetic Resonance (NMR) spectroscopy, as described in U.S. Pat. No. 9,593,209 at col. 32, Reference Example 2, may be used to measure molar ratio of M and Q units, where said ratio is expressed as {M(resin)+(M(neopentamer)}/{Q(resin)+Q(neopentamer)} and represents the molar ratio of the total number of triorganosiloxy groups of the resinous and neopentamer portions of the polyorganosilicate resin to the total number of silicate groups (Q units) in the resinous and neopentamer portions, the molar ratio of M, M', D, D', T, T' and Q of starting material (B) is expressed based on inclusion of organosiloxy groups of the resinous and the low molecular weight molecule.

Starting materials (A) and (B) are present in the composition in amounts sufficient to provide a weight ratio of (B) resin/(A) polymer (resin/polymer ratio) of 0.15/1 to <22/1, alternatively 0.15/1 to 9/1, alternatively 0.2/1 to 9/1, and alternatively 0.2/1 to 4/1.

(C) Polyorganohydrogensiloxane

The composition further comprises starting material (C), a polyorganohydrogensiloxane comprising unit formula $(R^5_3SiO_{1/2})_t(R^5_2HSiO_{1/2})_u(R^5_2SiO_{2/2})_v(R^5HSiO_{2/2})_w(R^5SiO_{3/2})_x(HSiO_{3/2})_y(SiO_{4/2})_z$. In this unit formula, each $R^5$ is an independently selected monovalent hydrocarbon group. Alternatively, each $R^5$ may be selected from the group consisting of alkyl groups and aryl groups. $R^5$ may be as described above for $R^1$. Subscripts t, u, v, w, x, y, and z represent numbers of each unit in the formula and have values such that t≥0, u≥0, v≥0, w≥0, x≥0, y≥0, z≥0, a quantity (u+w+y)≥2, and 2,000≥(t+u+v+w+x+y+z)≥3. Alternatively, the quantity (t+u+v+w+x+y+z) is sufficient to give the polyorganohydrogensiloxane a viscosity of 3 mPa·s to 1,000 mPa·s at 25° C., alternatively 5 mPa·s to 500 mPa·s at 25° C. Viscosity may be measured at 25° C. at 0.1 to 50 RPM on a Brookfield DV-III cone & plate viscometer with #CP-52 spindle. One skilled in the art would recognize that as viscosity increases, rotation rate decreases. Alternatively, the quantity (t+u+v+w+x+y+z) may be 3 to 2,000; alternatively 3 to 1,000; and alternatively 3 to 500.

Alternatively, when subscript x=y=z=0, the polyorganohydrogensiloxane may comprise unit formula $(R^5_3SiO_{1/2})_t(R^5_2HSiO_{1/2})_u(R^5_2SiO_{2/2})_v(R^5HSiO_{2/2})_w$, where subscript t is 0, 1, or 2; subscript u is 0, 1, or 2; a quantity (t+u)=2, subscript v≥0, subscript w≥0; and a quantity (u+w)≥3.

Polyorganohydrogensiloxanes for starting material (C) are exemplified by: Ci) dimethylhydrogensiloxy-terminated poly(dimethylsiloxane/methylhydrogensiloxane), Cii) dimethylhydrogensiloxy-terminated polymethylhydrogensiloxane, Ciii) trimethylsiloxy-terminated poly(dimethylsiloxane/methylhydrogensiloxane), Civ) trimethylsiloxy-terminated polymethylhydrogensiloxane, and Cv) a combination of two or more of Ci) to Civ).

Methods of preparing polyorganohydrogensiloxanes suitable for use as starting material (C), such as hydrolysis and condensation of organohalosilanes, are well known in the art, as exemplified in U.S. Pat. Nos. 5,310,843; 4,370,358; 4,707,531; and 4,329,273. Furthermore, polyorganohydrogensiloxanes are known in the art and are commercially available, e.g., from Dow Silicones Corporation of Midland, Michigan, USA, as well as those available from Gelest, Inc. of Morrisville, Pennsylvania, USA under the tradenames: HMS-301, DMS-HM15, DMS-H03, DMS-H25, DMS-H31, and DMS-H41. See also pages 18-21 of the same Reactive Silicones publication referenced above. Linear and cyclic polydiorganohydrogensiloxanes can also be prepared as described, for example in U.S. Pat. No. 2,823,218 to Speier, et al.; and U.S. Pat. No. 4,329,273.

The polyorganohydrogensiloxane is present in an amount sufficient to provide a molar ratio of silicon bonded hydrogen atoms in starting material (C) to reactive groups in the composition (SiH/reactive group ratio) of 0.05/1 to 2/1. As used herein, the term 'reactive groups' means, collectively, the aliphatically unsaturated monovalent hydrocarbon groups present in the starting materials described above and the (meth)acryloxyalkyl groups (i.e., represented by $R^2$ in the formulas above for starting material (B)). Alternatively, the SiH/reactive group ratio may be at least 0.05/1, alternatively at least 0.1/1, and alternatively at least 0.2/1. At the same time, the SiH/reactive group ratio may be up to 2/1, alternatively up to 1/1, and alternatively up to 0.9/1. Alternatively, SiH/reactive group ratio may be 0.1/1 to 2/1, alternatively 0.1/1 to 1/1, alternatively 0.2/1 to 1/1, alternatively 0.1/1 to 0.9/1, and alternatively 0.2/1 to 0.9/1.

(D) Hydrosilylation Reaction Catalyst

Starting material (D) in the composition is a hydrosilylation reaction catalyst. Hydrosilylation reaction catalysts include platinum group metal catalysts. For example, the hydrosilylation reaction catalyst can be Di) a metal selected from platinum, rhodium, ruthenium, palladium, osmium, and iridium. Alternatively, the hydrosilylation reaction catalyst may be Dii) a compound of such a metal, for example, chloridotris(triphenylphosphane)rhodium(I) (Wilkinson's Catalyst), a rhodium diphosphine chelate such as [1,2-bis(diphenylphosphino)ethane]dichlorodirhodium or [1,2-bis(diethylphospino)ethane]dichlorodirhodium, chloroplatinic acid (Speier's Catalyst), chloroplatinic acid hexahydrate, platinum dichloride; or Diii) a complex of such a compound with a low molecular weight organopolysiloxane. Alternatively, the hydrosilylation reaction catalyst may be Div) the compound microencapsulated in a matrix or core/shell type structure. For example, complexes of platinum with low molecular weight organopolysiloxanes include 1,3-diethenyl-1,1,3,3-tetramethyldisiloxane complexes with platinum (Karstedt's Catalyst). Alternatively, the hydrosilylation reaction catalyst may be Dv) the complex microencapsulated in a resin matrix. Exemplary hydrosilylation reaction catalysts are described in U.S. Pat. Nos. 3,159,601; 3,220,972; 3,296,291; 3,419,593; 3,516,946; 3,814,730; 3,989,668; 4,766,176; 4,784,879; 5,017,654; 5,036,117; and 5,175,325 and EP 0 347 895 B. Suitable hydrosilylation reaction catalysts are known in the art and are commercially available. For example, SYL-OFF™ 4000 Catalyst and SYL-OFF™ 2700 are available from Dow Silicones Corporation of Midland, Michigan, USA.

The amount of the hydrosilylation reaction catalyst used herein will depend on various factors including the selection of starting materials (A), (B), and (C) and their respective contents of aliphatically unsaturated monovalent hydrocarbon groups and silicon bonded hydrogen atoms, and whether a hydrosilylation reaction inhibitor is present, however, the amount of catalyst is sufficient to catalyze hydrosilylation reaction of SiH and aliphatically unsaturated monovalent hydrocarbon groups, alternatively the amount of catalyst is sufficient to provide 1 ppm to 1000 ppm of the platinum group metal based on combined weights of starting materials (A), (B), (C), (D), (E), and (F) in the composition; alternatively 2 ppm to 500 ppm, and alternatively 10 ppm to 100 ppm, on the same basis.

(E) Photoradical Initiator

Starting material (E) in the composition is a photoradical initiator. Suitable photoradical initiators include UV initiators such as benzophenone derivatives, acetophenone derivatives (α-hydroxy ketone), benzoin and its alkyl esters, phosphine oxide derivatives, xanthone derivatives, oxime ester derivatives, and camphor quinone. Photoradical initiators are commercially available. For example, photoradical initiators suitable for use herein include 2,6-bis(4-azido benzylidene)cyclohexanone, 2,6-bis(4-azido benzylidene)-4-methylcyclohexanone, 1-hydroxy-cyclohexyl-phenyl-ketone (OMNIRAD™ 184), 2-methyl-1[4-(methylthio)phenyl]-2-morpholinopropane-1-one (OMNIRAD™ 907); 2-hydroxy-2-methyl-1-phenyl-propane-1-one (OMNIRAD™ 1173); a mixed initiator (OMNIRAD® 500) of 50% of OMNIRAD™ 184C and 50% of benzophenone; a mixed initiator (OMNIRAD™ 1000) of 20% of OMNIRAD™ 184C and 80% of OMNIRAD™ 1173; 2-hydroxy-1-[4-(2-hydroxyethoxy)phenyl]-2-methyl-1-propanone (OMNIRAD™ 2959); methylbenzoylformate (OMNIRAD™ MBF); alpha, alpha-dimethoxy-alpha-phenylacetophenone (OMNIRAD™ 651); 2-benzyl-2-(dimethylamino)-1-[4-(4-morpholinyl)phenyl]-1-butanone (OMNIRAD™ 369); a mixed initiator (OMNIRAD™ 1300) of 30% of OMNIRAD™ 369 and 70% of OMNIRAD™ 651; diphenyl(2,4,6-trimethylbenzoyl)phosphine oxide (OMNIRAD™ TPO), ethyl(2,4,6-trimethylbenzoyl)phenyl phosphinate (OMNIRAD™ TPO-L), oxime ester compounds (N-1919, NCI-831, NCI-930, NCI-730, and NCI-100 supplied from Adeka Corporation), thioxanthen one; 10-methylphenothiazine; isopropyl-9H-thioxanthen-9-one; 2,4-diethyl-9H-thioxanthen-9-one; 2-chlorothioxanthen-9-one; 1-chloro-4-propoxy-9H-thioxanthen-9-one; or a combination of two or more thereof. The photoradical initiators with the OMNIRAD™ brands are commercially available from IGM Resins B.V., Netherland. Alternatively, the photoradical initiator may be selected from the group consisting of Ei) benzophenone, Eii) a substituted benzophenone compound, Eiii) acetophenone, Eiv) a substituted acetophenone compound, Ev) benzoin, Evi) an alkyl ester of benzoin, Evii) a substituted phosphine oxide compound, Eviii) xanthone, and Eix) a substituted xanthone; Ex) a substituted oxime ester compound, and Exi) a combination of two or more of Ei) to Ex). Alternatively, the photoradical initiator may be a substituted acetophenone, such as 1-hydroxycyclohexyl phenyl ketone. The type of photoradical initiator is not specifically restricted, however, some photoradical initiators, especially those containing thioether, phosphinate, or phosphine oxide groups, may inhibit the hydrosilylation reaction catalyst, therefore, when such a photoradical initiator will be included, the appropriate amount of (D) hydrosilylation reaction catalyst may need to be controlled and/or cure temperature/time may be adjusted.

The amount of photoradical initiator in the composition will depend on various factors including the desired reaction rate, the photoradical initiator used, and the selection and amount of starting material (B) and its content of (meth)acryloxyalkyl groups, however, the amount may be 0.01% to 10% based on combined weights of starting materials (A), (B), (C), (D), (E), and (F) in the composition. Alternatively, the amount of the photoradical initiator may be at least 0.1%, alternatively at least 0.5%, and alternatively at least 1% on the same basis. At the same time, the amount of photoradical initiator may be up to 10%, alternatively up to 8%, alternatively up to 6%, alternatively up to 5%, alternatively up to 4%, and alternatively up to 3%, on the same basis.

(F) Hydrosilylation Reaction Inhibitor

Starting material (F) in the composition is a hydrosilylation reaction inhibitor. Hydrosilylation reaction inhibitors are exemplified by acetylenic alcohols such as dimethyl hexynol, and 3,5-dimethyl-1-hexyn-3-ol, 1-butyn-3-ol, 1-propyn-3-ol, 2-methyl-3-butyn-2-ol, 3-methyl-1-butyn-3-ol, 3-methyl-1-pentyn-3-ol, 3-phenyl-1-butyn-3-ol, 4-ethyl-1-octyn-3-ol, 3,5-dimethyl-1-hexyn-3-ol, and 1-ethynyl-1-cyclohexanol (ETCH), and a combination thereof; cycloalkenylsiloxanes such as methylvinylcyclosiloxanes exemplified by 1,3,5,7-tetramethyl-1,3,5,7-tetravinylcyclotetrasiloxane, 1,3,5,7-tetramethyl-1,3,5,7-tetrahexenylcyclotetrasiloxane, and a combination thereof; ene-yne compounds such as 3-methyl-3-penten-1-yne, 3,5-dimethyl-3-hexen-1-yne, and a combination thereof; triazoles such as benzotriazole; phosphines; mercaptans; hydrazines; amines, such as tetramethyl ethylenediamine, 3-dimethylamino-1-propyne, n-methylpropargylamine, propargylamine, and 1-ethynylcyclohexylamine; fumarates including dialkyl fumarates such as diethyl fumarate and/or dialkenyl fumarates such as diallyl fumarate and/or dialkoxyalkyl fumarates, maleates such as diallyl maleate and diethyl maleate; nitriles; ethers; carbon monoxide; alkenes such as cyclo-octadiene, divinyltetramethyldisiloxane; alcohols such as benzyl alcohol; and a combination thereof.

Alternatively, the hydrosilylation reaction inhibitor may be a silylated acetylenic compound. Without wishing to be bound by theory, it is thought that adding a silylated acetylenic compound reduces yellowing of the reaction product prepared from hydrosilylation reaction as compared to a reaction product from hydrosilylation of starting materials that do not include a silylated acetylenic compound or that include an organic acetylenic alcohol inhibitor, such as those described above. The silylated acetylenic compound is exemplified by (3-methyl-1-butyn-3-oxy)trimethylsilane, ((1,1-dimethyl-2-propynyl)oxy)trimethylsilane, bis(3-methyl-1-butyn-3-oxy)dimethylsilane, bis(3-methyl-1-butyn-3-oxy)silanemethylvinylsilane, bis((1,1-dimethyl-2-propynyl)oxy)dimethylsilane, methyl(tris(1,1-dimethyl-2-propynyloxy))silane, methyl(tris(3-methyl-1-butyn-3-oxy))silane, (3-methyl-1-butyn-3-oxy)dimethylphenylsilane, (3-methyl-1-butyn-3-oxy)dimethylhexenylsilane, (3-methyl-1-butyn-3-oxy)triethylsilane, bis(3-methyl-1-butyn-3-oxy)methyltrifluoropropylsilane, (3,5-dimethyl-1-hexyn-3-oxy)trimethylsilane, (3-phenyl-1-butyn-3-oxy)diphenylmethylsilane, (3-phenyl-1-butyn-3-oxy)dimethylphenylsilane, (3-phenyl-1-butyn-3-oxy)dimethylvinylsilane, (3-phenyl-1-butyn-3-oxy)dimethylhexenylsilane, (cyclohexyl-1-ethyn-1-oxy)dimethylhexenylsilane, (cyclohexyl-1-ethyn-1-oxy)dimethylvinylsilane, (cyclohexyl-1-ethyn-1-oxy)diphenylmethylsilane, (cyclohexyl-1-ethyn-1-oxy)trimethylsilane, and combinations thereof. Alternatively, the silylated acetylenic compound is exemplified by methyl(tris(1,1-dimethyl-2-propynyloxy))silane, ((1,1-dimethyl-2-propynyl)oxy)trimethylsilane, or a combination thereof. The silylated acetylenic compound useful as the inhibitor herein may be prepared by methods known in the art, for example, U.S. Pat. No. 6,677,407 discloses silylating an acetylenic alcohol described above by reacting it with a chlorosilane in the presence of an acid receptor. Alternatively, the hydrosilylation reaction inhibitor may be selected from the group consisting of acetylenic alcohols, cycloalkenylsiloxanes, ene-yne compounds, triazoles, phosphines, mercaptans, hydrazines, amines, fumarates, maleates, nitriles, ethers, carbon monoxide, alcohols, and silylated acetylenic alcohols. Alternatively, the hydrosilylation reaction inhibitor may be an acetylenic alcohol, such as ETCH.

The amount of hydrosilylation reaction inhibitor used in the composition will depend on various factors including the desired reaction rate, the particular hydrosilylation reaction inhibitor used, and the selections and amounts of aliphatically unsaturated hydrocarbon groups and silicon bonded hydrogen atoms in the other starting materials in the composition. However, when present, the amount of the hydrosilylation reaction inhibitor may be at least 5 ppm, alternatively at least 0.05%, alternatively at least 0.1%, based on combined weights of starting materials (A), (B), (C), (D), (E), and (F) in the composition. At the same time, the amount of hydrosilylation reaction inhibitor may be up to 2%, alternatively up to 1%, on the same basis.

(G) Radical Scavenger

Starting material (G) is a radical scavenger that may optionally be added to the composition. Starting material (G) is a radical scavenger (scavenger) that may be used to control or inhibit a radical reaction of the composition. Because the composition comprises reactive (meth)acrylate-functional groups, a viable radical scavenger may be present to prevent premature reaction, for example, in storage and during use of a protective film prepared using the composition. And, the radical scavenger can be also used when preparing starting material (B), the resin having (meth)acryl-functional groups, to prevent premature reaction during reaction at high temperature. Scavengers comprising phenolic compounds are one class of such materials that may be used in the invention, including, for example, 4-methoxyphenol (MEHQ, methyl ether of hydroquinone), hydroquinone, 2-methylhydroquinone, 2-t-butylhydroquinone, t-butyl catechol, butylated hydroxy toluene, and butylated hydroxy anisole, and combinations of two or more thereof. Other scavengers that may be used include phenothiazine and anaerobic inhibitors, such as the NPAL type inhibitors (tris-(N-nitroso-N-phenylhydroxylamine)aluminum salt) from Albemarle Corporation, Baton Rouge, La. Alternatively, the radical scavenger may be selected from the group consisting of a phenolic compound, phenothiazine and an anaerobic inhibitor. Alternatively, the radical scavenger may be selected from the group consisting of a phenolic compound, phenothiazine and an anaerobic inhibitor. Radical scavengers are known, for example, in U.S. Pat. No. 9,475,968, and are commercially available. The amount of scavenger in the composition will depend on various factors including the type and amount of (meth)acryloxyalkyl groups in starting material (B), however the scavenger may be present in an amount of 0.001 parts by weight to 0.1 parts by weight, alternatively 0.001 parts by weight to 0.05 parts by weight, per 100 parts of starting material (B).

(H) Solvent

Starting material (H) is a solvent that may optionally be added to the composition. The solvent may be added during preparation of the composition, for example, to aid mixing and delivery of one or more starting materials and/or the solvent may be added after preparation of the composition, e.g., to facilitate coating the on a substrate, as described hereinbelow. When preparing the composition, certain starting materials may be delivered in solvent, such as (B) the resin and/or (C) the hydrosilylation reaction catalyst. Suitable solvents include organic liquids exemplified by, but not limited to, aromatic hydrocarbons, aliphatic hydrocarbons, ketones, esters, ethers, glycols, and glycol ethers. Hydrocarbons include benzene, toluene, xylene, naphtha, hexane, cyclohexane, methylcyclohexane, heptane, octane, decane, hexadecane, isoparaffin such as Isopar L (C11-C13), Isopar H(C11-C12), hydrogenated polydecene. Suitable ketones include, but are not limited to, acetone, methylethyl ketone, 2-pentanone, 3-pentanone, 2-hexanone, 2-heptanone, 4-heptanone, methyl isobutyl ketone, diisobutylketone, acetonylacetone, and cyclohexanone. Esters include ethyl acetate, propyl acetate, isopropyl acetate, butyl acetate, and isobutyl acetate Ethers include diethyl ether, dipropyl ether, diisopropyl ether, dibutyl ether, 1,2-dimethoxyethane, and 1,4-dioxane. Solvents having both ester and ether moieties include 2-methoxyethyl acetate, 2-ethoxyethyl acetate, propylene glycol monomethyl ether acetate, and 2-butoxyethyl acetate; ethers and esters further include, isodecyl neopentanoate, neopentylglycol heptanoate, glycol distearate, dicaprylyl carbonate, diethylhexyl carbonate, propylene glycol n-propyl ether, propylene glycol-n-butyl ether, ethyl-3 ethoxypropionate, propylene glycol methyl ether acetate, tridecyl neopentanoate, propylene glycol methylether acetate (PGMEA), propylene glycol methylether (PGME), dipropylene glycol methyl ether, or ethylene glycol n-butyl ether, octyldodecyl neopentanoate, diisobutyl adipate, diisopropyl adipate, propylene glycol dicaprylate/dicaprate, octyl ether, and octyl palmitate. Alternatively, the solvent may be selected from polyalkylsiloxanes, ketones, glycol ethers, tetrahydrofuran, mineral spirits, naphtha, or a combination thereof. Polyalkylsiloxanes with suitable vapor pressures may be used as the solvent, and these include hexamethyldisiloxane, octamethyltrisiloxane, hexamethylcyclotrisiloxane, octamethylcyclotetrasiloxane, decamethylcyclopentasiloxane, tris(trimethylsiloxy)methylsilane, tetrakis(trimethylsiloxy)silane, dodecamethylcyclohexasiloxane, octamethyltrisiloxane, decamethyltetrasiloxane, dodecamethylpentasiloxane, tetradecamethylhexasiloxane, hexadecamethylheptasiloxane, heptamethyl-3-{(trimethylsilyl)oxy)} trisiloxane, hexamethyl-3,3, bis{(trimethylsilyl)oxy} trisiloxane pentamethyl{(trimethylsilyl)oxy}cyclotrisiloxane, and combinations thereof. Low molecular weight polyalkylsiloxanes, such as 0.5 to 1.5 cSt polydimethylsiloxanes are known in the art and commercially available as DOWSIL™ 200 Fluids and DOWSIL™ OS FLUIDS, which are commercially available from Dow Silicones Corporation. Alternatively, the solvent may be selected from the group consisting of an aliphatic hydrocarbon, an aromatic hydrocarbon, an ether, an ester, and a solvent having both ether and ester moieties. Alternatively, the solvent may be selected from the group consisting of an aliphatic hydrocarbon and an aromatic hydrocarbon.

The amount of solvent will depend on various factors including the type of solvent selected and the amount and type of other starting materials selected to adjust viscosity for coating. Alternatively, the amount of solvent may be 0 to 300 parts by weight, per 100 parts by weight of all starting materials in the composition. Alternatively, the amount of solvent may be 0.5 parts by weight to 200 parts by weight, alternatively 20 parts by weight to 300 parts by weight, per 100 parts by weight of all starting materials in the composition.

(I) Non-Functional Polyorganosilicate Resin

The composition may optionally further comprise starting material (I) a non-functional polyorganosilicate resin. Without wishing to be bound by theory, it is thought that the non-functional polyorganosilicate resin may act as a tackifier to modify mechanical properties and/or help to control initial adhesion strength of the PSA (formed by curing the composition via hydrosilylation reaction). Starting material (I) is used in the composition may be used in an amount sufficient to provide a weight ratio of (I) the non-functional resin to (A) the polydiorganosiloxane (Nonfunctional Resin/Polymer Ratio) of 0.1/1 to 4/1. Starting material (I) is a polyorganosilicate resin comprising units of formulae $(R^1{}_3SiO_{1/2})_p(SiO_{4/2})_q(ZO)_h$, where IV, Z, and subscript h are as described above, and subscripts p and q have values such that a molar ratio (p/q) is 0.6 to <1.9, and Mw=1,000-30,000 Daltons. Such non-functional resins are known in the art and are commercially available. Such non-functional resins may be prepared as described above for starting material (B), but by substituting the (meth)acryl-functional starting materials with starting materials having alkyl and/or aryl groups, e.g., alkylhalosilanes such as methylchlorosilanes and/or alkyl alkoxysilanes such as methylmethoxysilanes.

(J) Anchorage Additive

Optionally, the composition may further comprise an anchorage additive (J), which may be added in order to improve its adherence to a substrate film. The starting material (J) can be exemplified by silane coupling agents such as methyltrimethoxysilane, vinyltrimethoxysilane, allyltrimethoxysilane, 3-methacryloxypropyltrimethoxysilane, 3-glycidoxypropyltrimethoxysilane, 2-(3,4-epoxycyclohexyl)ethyltrimethoxysilane, 3-aminopropyltrimethoxysilane, N-(2-aminoethyl)-3-aminopropyltrimethoxysilane, bis(trimethoxysilyl)propane, and bis(trimethoxysilyl)hexane; mixtures or reaction mixtures of said silane coupling agents and siloxane compounds having at least one silicon-bonded hydroxy group and a silicon-bonded alkenyl group. Anchorage additives are commercially available, for example, 2-(3,4-epoxycyclohexyl)ethyltrimethoxysilane is available as DOWSIL™ Z-6043 Silane from Dow Silicones. The amount of anchorage additive, when present, may be 0.05 to 5 parts by weight, per 100 parts by weight of all starting materials in the composition.

Method for Making the Composition and PSA

The composition can be prepared by a method comprising combining all starting materials by any convenient means such as mixing at RT or elevated temperature. The hydrosilylation reaction inhibitor may be added before the hydrosilylation reaction catalyst, for example, when the composition will be prepared at elevated temperature and/or the composition will be prepared as a one part composition.

The method may further comprise delivering one or more starting materials in a solvent (e.g., the linear polydiorganosiloxane polymer (A), the (meth)acryloxyalkyl-functional polyorganosiloxane resin (B) and/or the hydrosilylation reaction catalyst (D), and/or, when present, the non-functional resin (I)) may be dissolved in a solvent when combined with one or more of the other starting materials in the composition. Optionally, thereafter all or substantially all of the solvent may be removed by conventional means such as stripping and/or distillation, optionally with reduced pressure). One skilled in the art would understand that the resulting composition contains no solvent or may contain trace amounts of residual solvent from delivery of a starting material, however, in certain instances, a solvent (e.g., organic solvent such as toluene or non-functional polydiorganosiloxane) is not intentionally added to the composition. Alternatively, the composition may be solvent borne.

Alternatively, the composition may be prepared as a multiple part composition, for example, when the composition will be stored for a long period of time before use, e.g., up to 6 hours before coating the composition on a substrate.

In the multiple part composition, the hydrosilylation reaction catalyst is stored in a separate part from any starting material having a silicon bonded hydrogen atom, for example, the polyorganohydrogensiloxane, and the parts are combined shortly before use of the composition.

For example, a multiple part composition may be prepared by combining starting materials comprising at least some of (A) the polymer, (C) the polyorganohydrogensiloxane, and optionally one or more other additional starting materials described above to form a base part, by any convenient means such as mixing. A curing agent may be prepared by combining starting materials comprising at least some of (A) the polymer, (D) the hydrosilylation reaction catalyst, and optionally one or more other additional starting materials described above by any convenient means such as mixing. The starting materials may be combined at ambient or elevated temperature. The hydrosilylation reaction inhibitor may be included in one or more of the base part, the curing agent part, or a separate additional part. Starting material (I) the non-functional resin, when present, may be added to the base part, the curing agent part, or a separate additional part. Starting material (B) the (meth)acryloxyalkyl-functional polyorganosiloxane resin may be added to the base part. The photoradical initiator and (G) the free radical scavenger may be added to the base part or a separate additional (e.g., third) part. Starting material (J), the anchorage additive, when present, may be added to the base part.

When a two part composition is used, the weight ratio of amounts of base part to curing agent part may range from 1:1 to 10:1. The composition will cure via hydrosilylation reaction to form a PSA with an initial adhesion. Curing via hydrosilylation reaction at RT or by heating at a temperature of 60° C. to 220° C., alternatively 70° C. to 170° C., and alternatively 80° C. to 160° C., for a time sufficient to form the PSA from the composition.

Preparation of an Adhesive Article

The method described above may further comprise one or more additional steps. The composition prepared as described above may be used to form an adhesive article, e.g., a pressure sensitive adhesive (prepared by thermally curing the composition described above) on a substrate. The method may, therefore, further comprise comprises applying the composition to a substrate.

Applying the composition to the substrate can be performed by any convenient means. For example, the pressure sensitive adhesive curable composition may be applied onto a substrate by gravure coater, offset coater, offset-gravure coater, roller coater, reverse-roller coater, air-knife coater, or curtain (slot-die) coater.

The substrate can be any material that can withstand the curing conditions (described below) used to cure the composition to form the PSA on the substrate. For example, any substrate that can withstand heat treatment at a temperature equal to or greater than 120° C., alternatively 150° C. is suitable. Examples of materials suitable for such substrates including plastic films such as polyimide (PI), polyetheretherketone (PEEK), polyethylene naphthalate (PEN), liquid-crystal polyarylate, polyamideimide (PAI), polyether sulfide (PES), polyethylene terephthalate (PET), polyethylene (PE), or polypropylene (PP). The thickness of the substrate is not critical, however, the thickness may be 5 micrometers to 300 micrometers, alternatively 25 micrometers to 300 micrometers. The substrate may be transparent, alternatively, substrates which are not transparent may be used provided that they allow the PSA to be exposed to UV radiation.

To improve bonding of the PSA to the substrate, the method for forming the adhesive article may optionally further comprise treating the substrate before applying the composition. Treating the substrate may be performed by any convenient means, such as applying a primer, or subjecting the substrate to corona-discharge treatment, etching, or plasma treatment before applying the composition to the substrate.

An adhesive article such as a protective film or tape may be prepared by applying the composition described above onto the substrate described above. The method may optionally further comprise removing the all, or a portion, of the solvent before and/or during curing (if solvent is present). Removing solvent may be performed by any convenient means, such as heating at a temperature that vaporizes the solvent without fully curing the composition, e.g., heating at a temperature of 70° C. to 120° C., alternatively 50° C. to 100° C., and alternatively 70° C. to 80° C. for a time sufficient to remove all or a portion of the solvent (e.g., 30 seconds to 1 hour, alternatively 1 minute to 5 minutes). The method then further comprises curing the composition (which may have some or all of the solvent removed when the drying step is performed) via hydrosilylation reaction at RT or by heating at a temperature of 60° C. to 220° C., alternatively 70° C. to 170° C., and alternatively 80° C. to 160° C., for a time sufficient to form the PSA on the surface of the substrate (e.g., for 30 seconds to an hour, alternatively 15 min to 45 min). Drying to remove all or a portion of the solvent and/or hydrosilylation reaction curing may be performed by placing the substrate in an oven. The amount of the composition to be applied to the substrate depends on the specific application, however, the amount may be sufficient such that after curing thickness of the PSA may be 50 micrometers to 1,000 micrometers, alternatively 100 micrometers to 700 micrometers, and alternatively 200 micrometers to 600 micrometers; after cure via hydrosilylation reaction.

Therefore, the method for forming the adhesive article (e.g., in the form of a protective film) comprising a PSA layer on a surface of a substrate comprises:
  optionally 1) treating the surface of the substrate as described above;
  2) applying the composition described above to the surface of the substrate, and
  optionally 3) removing all or a portion of the solvent, if present,
  4) curing the composition via hydrosilylation reaction to form the PSA layer on the surface of the substrate.

The method steps 2) to 4) described above may be repeated one or more times to obtain an increase thickness of the PSA layer, if desirable. (The desirable thickness is described herein). The method described above may optionally further comprise applying a removable release liner to the PSA layer opposite the substrate, e.g., to protect the PSA before use. The release liner may be removed before use of the adhesive article. The obtained PSA layer contains a free (meth)acryl-functional group, which can be analyzed by Fourier Transform-Infrared (FT-IR) spectroscopy, and its relative amount of the PSA film and its reaction when exposed to UV irradiation could be monitored by the absorption intensity of unsaturated bond's vibration in FT-IR spectrum as illustrated in 'UV coatings: basics, recent developments and new applications', at page 33 (Elsevier; 2006 Dec. 21) to Schwalm; Polymer Chemistry. 2013; 4(8):2449-56 to Espeel. The free (meth)acryl-functional group in the PSA by using starting material (B) was detected at around 1296 $cm^{-1}$ and 938 $cm^{-1}$.

Methods of Use

The method described above may further comprise using the protective film in a method for fabricating an (opto)electronic device. The method may include exposing the PSA layer to actinic radiation, such as UV radiation. For example, in a method for fabricating an (opto)electronic device the improvement may comprise:

5) applying the protective film prepared as described above to the (opto)electronic device such that PSA layer contacts a surface in the (opto)electronic device;
6) using the protective film to protect the device; and thereafter
7) exposing the PSA layer to actinic radiation, such as UV radiation. The adhesion will increase as a result of the radiation exposure in step 6). A regular (permanent) adhesive may be formed.

The irradiation in step 7) can be performed using a general ultraviolet irradiation apparatus, for example, a face type or a conveyer belt-type ultraviolet irradiation apparatus, where a low-pressure mercury lamp, a medium-pressure mercury lamp, a high-pressure mercury lamp, an ultrahigh-pressure mercury lamp, a xenon lamp, a metal halide lamp, an electrodeless lamp, an ultraviolet light-emitting diodes or the like is used as the light source. The ultraviolet irradiation dose is generally from 0.1 to 10 W/cm$^2$ for 0.1 to 120 seconds (=0.1 to 1200 J/cm$^2$).

EXAMPLES

These examples are provided to illustrate the invention to one of ordinary skill in the art and are not to be construed as limiting the scope of the invention set forth in the claims. The starting materials used in the examples are described below in Table 1.

TABLE 1

| Starting Materials | | |
| --- | --- | --- |
| Starting Material | Chemical Description | Source |
| DOWSIL ™ Z-6033 | 3-methacryloxypropylmethyldimethoxysilane (CAS#14513-34-9) | Dow Silicones |
| DOWSIL ™ Z-6030 | 3-methacryloxypropylmethyltrimethoxysilane (CAS#2530-85-0) | Dow Silicones |
| OH Fluid | bis-hydroxy-terminated polydimethylsiloxane with DP of 30 and CAS#70131-67-8 | Dow Silicones |
| | bis-hydroxyl terminated polydimethylsiloxane (DP = 11) | Dow Silicones |
| End-Block | bis-dimethylvinylsiloxy-terminated polydimethylsiloxane CAS#68083-19-2 | Dow Silicones |
| A-1 | Bis-vinyldimethylsiloxy-terminated polydimethylsiloxane with Vi content = 0.012% (0.0044 mmol/g), and unit formula $M^{Vi}D^{Me}_{7098}M^{Vi}$, CAS#68083-19-2 | Dow Silicones |
| A-2 | Bis-vinyldimethylsiloxy-terminated methylvinyl-dimethylsiloxane copolymer with Vi content = 0.065% (0.0241 mmol/g), and unit formula $M^{Vi}D^{Me}_{7084}D^{Vi}_{11.3}M^{Vi}$, CAS#68083-18-1 | Dow Silicones |
| A-3 | Bis-vinyldimethylsiloxy-terminated methylvinyl-dimethylsiloxane copolymer with Vi content = 0.19% (0.0704 mmol/g) and unit formula $M^{Vi}D^{Me}_{4829}D^{Vi}_{25}M^{Vi}$, CAS#68083-18-1 | Dow Silicones |
| A-4 | Bis-vinyldimethylsiloxy-terminated polydimethylsiloxane with Vi content = 0.44% (0.1630 mmol/g) and unit formula $M^{Vi}D^{Me}_{139}M^{Vi}$; Viscosity at 25° C. = 500 mPa · s, CAS# 68083-19-2 | Dow Silicones |
| A'-5 | Bis-vinyldimethylsiloxy-terminated poly(dimethyl/methyl, methacryloxypropyl)siloxane copolymer with Vi content = 0.0090 mmol/g, Vi + MA content = 1.0180 mmol/g and unit formula $M^{Vi}D^{MA}_{232}D^{Me}_{2488}M^{Vi}$ | See Comparative Reference Example 1 for Synthesis |
| B-1 | $M^{Me}_{49.6}D^{MA}_{3.9}Q_{46.5}(OH)_{0.45}(OCH_3)_{0.03}$, where the subscripts represent relative molar amounts of each unit in the polyorganosilicate resin and where the resin had Mn of 2047 and Mw/Mn of 1.425 by GPC, and MA content = 0.518 mmol/g | See Reference Example 1 for Synthesis |

TABLE 1-continued

Starting Materials

| Starting Material | Chemical Description | Source |
|---|---|---|
| B-2 | $M^{Me}_{47.7}D^{MA}_{8.7}Q_{43.6}(OH)_{0.75}$, where the subscripts represent relative molar amounts of each unit in the polyorganosilicate resin and where the resin had Mn of 2095 and Mw/Mn of 1.327 by GPC, and MA content = 1.074 mmol/g | See Reference Example 2 for Synthesis |
| B-3 | $M^{Me}_{52}T^{MA}_{2.1}Q_{45.9}(OH)_{0.92}$ where the subscripts represent relative molar amounts of each unit in the polyorganosilicate resin and where the resin had Mn of 2131 and Mw/Mn of 1.47 by GPC, and MA content = 0.286 mmol/g. | See Reference Example 3 for Synthesis |
| B-4 | $M^{Me}_{50.2}T^{MA}_{4.6}Q_{45.2}(OH)_{0.83}$, where the subscripts represent relative molar amounts of each unit in the polyorganosilicate resin, and where the resin had Mn of 2324 and Mw/Mn of 1.48 by GPC, and MA content = 0.605 mmol/g. | See Reference Example 4 for Synthesis |
| B-5 | $M^{Me}_{38.1}D^{MA}_{8.8}D^{Me}_{17.3}Q_{35.8}(OH)_{0.97}$, where the subscripts represent relative molar amounts of each unit in the polyorganosilicate, and where the resin had Mn of 2079 and Mw/Mn of 1.45 by GPC, and MA content = 1.080 mmol/g. | See Reference Example 5 for Synthesis |
| B-6 | $M^{Me}_{40.1}D^{MA}_{3.7}D^{Me}_{18.8}Q_{37.4}(OH)_{0.91}$, where the subscripts represent relative molar amounts of each unit in the polyorganosilicate resin, and where the resin had Mn of 2114 and Mw/Mn of 1.504 by GPC, and MA content = 0.489 mmol/g. | See Reference Example 6 for Synthesis |
| B-7 | $M^{Me}_{50.4}D^{MA}_{2.2}Q_{47.4}(OH)_{0.92}$, where the subscripts represent relative molar amounts of each unit in the polyorganosilicate resin, and where the resin had Mn of 2082 and Mw/Mn of 1.347 by GPC, and MA content = 0.3 mmol/g. | See Reference Example 7 for Synthesis |
| B-8 | $M^{Me}_{41}D^{MA}_{1.8}D^{Me}_{18.4}Q_{38.8}(OH)_{0.95}$, where the subscripts represent relative molar amounts of each unit in the polyorganosilicate resin, and where the resin had Mn of 2329 and Mw/Mn of 1.56 by GPC, , and MA content = 0.245 mmol/g. | See Reference Example 8 for Synthesis |
| C-1 | Poly(methylhydrosiloxane), trimethylsilyl terminated, SiH = 16 mmol/g, 20 cst (CAS#63148-57-2) | Dow Silicones DOWSIL ™ 7028 Crosslinker |
| C-2 | Poly(dimethylsiloxane-co-methylhydrosiloxane), trimethylsilyl terminated, SiH = 10.5 mmol/g, 30 cst (CAS#68037-59-2) | Dow Silicones DOWSIL ™ 7678 Crosslinker |
| C-3 | Methylhydrosiloxane-dimethylsiloxane copolymer, hydride terminated, SiH = 4.3 mmol/g, 13 cst (CAS#69013-23-6) | Dow Silicones |
| C-4 | Poly(dimethylsiloxane-co-methylhydrosiloxane), trimethylsilyl terminated, SiH = 8.3 mmol/g, 5 cst (CAS#68037-59-2) | Dow Silicones DOWSIL ™ 6-3570 Crosslinker |
| C-5 | Hydride terminated polydimethylsiloxane, SiH = 0.13 mmol/g, 450 cst, (CAS# 70900-21-9) | Dow Silicones |
| D-1 | Platinum catalyst (Active Pt = 5200 ppm); Platinum, 1,3-diethenyl-1,1,3,3-tetramethyldisiloxane complexes CAS# 68478-92-2 | Dow Silicones |

TABLE 1-continued

Starting Materials

| Starting Material | Chemical Description | Source |
|---|---|---|
| E-1 OMNIRAD ™ 184 | 1-Hydroxycyclohexyl phenyl ketone CAS# 947-19-3 | IGM Resins |
| E-2 OMNIRAD ™ 369 | 2-Benzyl-2-(dimethylamino)-1-[4-(morpholinyl)phenyl)]-1-butanone CAS#119313-12-1 | IGM Resins |
| F-1 ETCH | 1-Ethynyl-1-cyclohexanol CAS# 78-27-3 | Dow Chemical |
| G-1 MEHQ | 4-Methoxyphenol CAS# 150-76-5 | Sigma-Aldrich |
| H-1 | Toluene | Sigma-Aldrich |
| I-1 | MQ Resin; 75% Silicic acid, sodium salt, reaction products with chlorotrimethylsilane and iso-Pr alcohol, in xylene (CAS# 68988-56-7), Mn = 2131, Mw/Mn of 1.43 by GPC | Dow Silicones |
| Anchorage Additive | 2-(3,4-epoxycylclohexyl)ethyltrimethoxysilane CAS#3388-04-3 | Dow Silicones Z-6043 |

Comparative Reference Example 1: Preparation of Starting Material A'-5

In this A bis-vinyldimethylsiloxy-terminated poly(dimethyl/methyl,methacryloxypropyl)siloxane copolymer shown as comparative Starting Material A'-5 in Table 1, above, was synthesized as follows. To a 4-neck 1 liter round bottom flask 3-methacryloxypropyl methyl dimethoxysilane (108.92 g, DOWSIL™ Z-6033) and 0.1N HCl (128.87 g) were added and mixed using a magnetic stir bar at −23° C. Using a simple distillation glassware setup vacuum was pulled to −20 mmHg for 1.5 hours. After 1.5 hours the vacuum was released and bis-hydroxy-terminated polydimethylsiloxane (1179.75 g, OH Fluid in Table 1) along with 0.34 g of (G-1) MEHQ were added to the reaction solution. The magnetic stir bar was removed and a Teflon paddle with a glass stir rod was used to mix the solution. Vacuum was pulled to −5 mmHg, and the reaction was heated at 80° C. for 1.5 hours. The simple distillation glassware setup was dissembled, and a Dean Stark distillation setup was used for the last reaction step. To the reaction solution, (H-1) toluene (380 g, Sigma-Aldrich) and bis-dimethylvinylsiloxy-terminated polydimethylsiloxane (2.87 g, End-Block in Table 1) were added. The solution was then heated to 111-115° C., with 0.3 mL of phosphazene catalyst being added when temperature reached 90° C. The overheads were collected in the Dean Stark trap, and an additional 0.3 mL of phosphazene catalyst was added. The solution was held at toluene reflux for 1 h. The heat was removed, and the solution was cooled. At −60° C., trihexylamine (0.3 g, Sigma-Aldrich) was added to the reaction solution and mixed for 2 hours. And, the solution was heated to 120° C. with nitrogen/2% oxygen gas bubbling for 1 h and cooled to RT. The solid content of the solution was adjusted to 75% by adding additional toluene. Then, the obtained resin in solution (75% resin/25% solvent) was identified as having unit formula $M^{Vi}D^{MA}_{232}D^{Me}_{2488}M^{Vi}$.

Reference Example 1: Preparation of Starting Material B-1

In a 500 ml three-necked flask equipped with a mechanical stirrer, thermometer, and Dean Stark trap; a mixture of 375.31 g of a solution containing 75% (I-1) MQ Resin dissolved in 25% xylene, 1.5 g of 11 N KOH aqueous solution, and toluene was refluxed to remove water for 2 hours. 46.47 g of Z-6033 and 0.11 g of (G-1) MEHQ was added to the mixture and the resulting mixture was refluxed for 5 hrs. After cooling to the below 50° C., toluene, methanol, water was added and refluxed for 1 hours at 73° C. The methanol and water were removed with toluene. Toluene corresponding to the lost toluene with methanol and water was added to the mixture. The resulting mixture was additionally refluxed for 3 hours. After cooling to room temperature, acetic acid was added. The mixture was stirred for 1 hour and then filtered. The obtained resin in solution (75% resin/25% solvent) was identified as having unit formula $M^{Me}_{49.6}D^{MA}_{3.9}Q_{46.5}(OH)_{0.45}(OCH_3)_{0.03}$, with Mn of 2047 and Mw/Mn of 1.425 by GPC and 75% of solid content (B-1 in Table 1 above).

Reference Example 2: Preparation of Starting Material B-2

In a 500 ml three-necked flask equipped with a mechanical stirrer, thermometer, and condenser; a mixture of 92.94 g of Z-6030, 375.31 g of a solution containing 75% (I-1) MQ Resin dissolved in 25% xylene, 15 g of water and 0.11 g of (G-1) MEHQ was placed in a flask, and 0.6 g of trifluoromethane sulfonic acid (Aldrich) was added to a mixture with stirring at room temperature. Then, the temperature was raised to 47° C. After 1 hours, a mixture was cooled to room temperature, 25.62 g of methanol, 1.5 g of 11 N KOH aqueous solution and toluene was added in order and refluxed for 2 hours. After the Dean Stark trap was replaced with a condenser, the temperature was gradually raised up to 125° C. to remove methanol and water with toluene. After removing water and methanol, the resulting mixture was additionally refluxed for 9 h. After cooling to RT, acetic acid was added. The mixture was stirred for 1 h and then filtered. The obtained resin in solution (75% resin/25% solvent) was identified as having unit formula $M^{Me}_{47.7}D^{MA}_{8.7}Q_{43.6}(OH)_{0.75}$, with Mn of 2095 and Mw/Mn of 1.327 by GPC and 75% of solid content (B-2 in Table 1 above).

Reference Example 3: Preparation of Starting Material B-3

In a 500 ml three-necked flask equipped with a mechanical stirrer, thermometer, and condenser; a mixture of 24.84 g of Z-6030, 375.31 g of a solution containing 75% (I-1) MQ Resin dissolved in 25% xylene, 7 g of water and 0.11 g of (G-1) MEHQ was placed in a flask, and 0.5 g of trifluoromethane sulfonic acid (Aldrich) was added to a mixture with stirring at room temperature. Then, the temperature was raised to 47° C. After 1 h, a mixture was cooled to room temperature, 25.62 g of methanol, 1.44 g of 11 N KOH aqueous solution and toluene was added in order and refluxed for 2 h. After Dean Stark trap was replaced with condenser, the temperature was gradually raised up to 125° C. to remove methanol and water with toluene. After removing water and methanol, the resulting mixture was additionally refluxed for 9 h. After cooling to room temperature, acetic acid was added. The mixture was stirred for 1 h and then filtered. The obtained resin in solution (75% resin/25% solvent) was identified as having unit formula $M^{Me}{}_{52}T^{MA}{}_{2.1}Q_{45.9}(OH)_{0.92}$, with Mn of 2131 and Mw/Mn of 1.47 by GPC and 75% of solid content (B-3 in Table 1 above).

Reference Example 4: Preparation of Starting Material B-4

In a 500 ml three-necked flask equipped with a mechanical stirrer, thermometer, and condenser; a mixture of 49.67 g of Z-6030, 13 g of water and 0.1 g of (G-1) MEHQ was placed in a flask, and 0.5 g of trifluoromethane sulfonic acid was added to a mixture during stirring at RT. Then, the temperature was gradually raised to 47° C. After cooling to RT, 375.31 g of a solution containing 75% (I-1) MQ Resin dissolved in 25% xylene, 25.62 g of methanol, 1.5 g of 11 N KOH aqueous solution, and toluene was added in order, and refluxed for 2 h. After the Dean Stark trap was replaced with a condenser, the temperature was gradually raised up to 125° C. to remove methanol and water with toluene. After removing water and methanol, the resulting mixture was additionally refluxed for 12 h. After cooling to RT, acetic acid was added. The mixture was stirred for 1 h and then filtered. The obtained resin in solution (75% resin/25% solvent) was identified as having unit formula $M^{Me}{}_{50.2}T^{MA}{}_{4.6}Q_{45.2}(OH)_{13.83}$, with Mn of 2324 and Mw/Mn of 1.48 by GPC and 75% of solid content (B-4 in Table 1 above).

Reference Example 5: Preparation of Starting Material B-5

In a 500 ml three-necked flask equipped with a mechanical stirrer, thermometer, and condenser; a mixture of 116.18 g of Z-6030, 81.70 g of bis-hydroxyl terminated polydimethylsiloxane (DP=11), 18 g of water and 0.13 g of (G-1) MEHQ was placed in a flask, and 0.6 g of trifluoromethane sulfonic acid was added to a mixture during stirring at room temperature. Then, the temperature was gradually raised to 47° C. After cooling to RT, 375.31 g of a solution containing 75% (I-1) MQ Resin dissolved in 25% xylene, 32.02 g of methanol, 1.73 g of 11 N KOH aqueous solution, and toluene was added in order, and refluxed for 2 h. After the Dean Stark trap was replaced with a condenser, the temperature was gradually raised up to 125° C. to remove methanol and water with toluene. After removing water and methanol, the resulting mixture was additionally refluxed for 9 h. After cooling to RT, acetic acid was added. The mixture was stirred for 1 h and then filtered. Toluene and xylene was evaporated under reduced pressure at 100° C. for 2 h. The obtained viscous resin was identified as having unit formula $M^{Me}{}_{38.1}D^{MA}{}_{8.8}D^{Me}{}_{17.3}Q_{35.8}(OH)_{0.97}$, with Mn of 2079 and Mw/Mn of 1.45 by GPC and 75% of solid content (B-5 in Table 1 above).

Reference Example 6: Preparation of Starting Material B-6

In a 500 ml three-necked flask equipped with a mechanical stirrer, thermometer, and condenser; a mixture of 46.47 g of Z-6030, 81.70 g of bis-hydroxyl terminated polydimethylsiloxane (DP=11), 8.7 g of water and 0.13 g of (G-1) MEHQ was placed in a flask, and 0.6 g of trifluoromethane sulfonic acid was added to a mixture during stirring at RT. Then, the temperature was gradually raised to 47° C. After cooling to RT, 375.31 g of a solution containing 75% (I-1) MQ Resin dissolved in 25% xylene, 50 g of methanol, 1.73 g of 11 N KOH aqueous solution, and toluene was added in order, and refluxed for 2 h. After the Dean Stark trap was replaced with a condenser, the temperature was gradually raised up to 125° C. to remove methanol and water with toluene. After removing water and methanol, the resulting mixture was additionally refluxed for 9 h. After cooling to RT, acetic acid was added. The mixture was stirred for 1 h and then filtered. Toluene and xylene was evaporated under reduced pressure at 100° C. for 2 h. The obtained viscous resin was identified as having unit formula $M^{Me}{}_{40.1}D^{MA}{}_{3.7}D^{Me}{}_{18.8}Q_{37.4}(OH)_{0.91}$, with Mn of 2114 and Mw/Mn of 1.504 by GPC and 75% of solid content (B-6 in Table 1 above).

Reference Example 7: Preparation of Starting Material B-7

In a 500 ml three-necked flask equipped with a mechanical stirrer, thermometer, and condenser; a mixture of 23.24 g of Z-6030, 4.3 g of water and 0.11 g of (G-1) MEHQ was placed in a flask, and 0.5 g of trifluoromethane sulfonic acid was added to a mixture during stirring at RT. Then, the temperature was gradually raised to 47° C. After cooling to RT, 375.31 g of a solution containing 75% (I-1) MQ Resin dissolved in 25% xylene, 50 g of methanol, 1.44 g of 11 N KOH aqueous solution, and toluene was added in order, and refluxed for 2 h. After the Dean Stark trap was replaced with a condenser, the temperature was gradually raised up to 125° C. to remove methanol and water with toluene. After removing water and methanol, the resulting mixture was additionally refluxed for 9 h. After cooling to RT, acetic acid was added. The mixture was stirred for 1 h and then filtered. The obtained resin in solution (75% resin/25% solvent) was identified as having unit formula $M^{Me}{}_{50.4}D^{MA}{}_{2.2}Q_{47.4}(OH)_{0.92}$, with Mn of 2082 and Mw/Mn of 1.347 by GPC and 75% of solid content (B-7 in Table 1 above).

Reference Example 8: Preparation of Starting Material B-8

In a 500 ml three-necked flask equipped with a mechanical stirrer, thermometer, and condenser; a mixture of 23.24 g of Z-6030, 81.70 g of bis-hydroxyl terminated polydimethylsiloxane (DP=11), 4.4 g of water and 0.13 g of (G-1) MEHQ was placed in a flask, and 0.6 g of trifluoromethane sulfonic acid was added to the mixture during stirring at RT. Then, the temperature was gradually raised to 47° C. After cooling to RT, 375.31 g of a solution containing 75% (I-1) MQ Resin dissolved in 25% xylene, 50 g of methanol, 1.73 g of 11 N KOH aqueous solution, and toluene was added in order, and refluxed for 2 h. After the Dean Stark trap was replaced with a condenser, the temperature was gradually raised up to 125° C. to remove methanol and water with toluene. After removing water and methanol, the resulting mixture was additionally refluxed for 9 h. After cooling to RT, acetic acid was added. The mixture was stirred for 1 h and then filtered. The obtained resin in solution (75% resin/25% solvent) was identified as having unit formula $M^{Me}_{41}D^{MA}_{1.8}D^{Me}_{18.4}Q_{38.8}(OH)_{0.95}$, with Mn of 2329 and Mw/Mn of 1.56 by GPC and 75% of solid content (B-8 in Table 1 above).

In this Reference Example 9, silicone-(meth)acrylate pressure sensitive adhesive compositions and comparative compositions were made. Starting materials (A) and (B) may have been dissolved in a solvent. The general procedure was as follows: For preparing the sample labelled Inv. 1, a solution was prepared by mixing the following starting materials in a mixer: Firstly, the starting material (A-1) was dissolved in toluene (H-1) to obtain 30% solution by mixing. Then, 133.33 g of the solution containing 100 g of starting material (A-1) dissolved in toluene (H-1); 23.66 g of the solution containing 17.75 g of staring material (B-1) dissolved in solvents; 0.59 g of polyorganohydrogensiloxane (C-1); 0.05 g of hydrosilylation reaction inhibitor (F-1) were mixed. After mixing of above starting materials, the obtained solution was further mixed with 1.18 g of hydrosilylation reaction catalyst (D-1) and 3.55 g of photoradical initiator (E-1). Mixing of the above starting materials with the aforementioned solution produced a silicone-(meth) acrylate pressure sensitive adhesive composition. This composition was used for manufacturing an adhesive tape. The adhesive tape was evaluated with regard to the lamination property and adhesive force. Comparative Examples, Inv. 2-29 and Inv. 32-38 were prepared in the same manner using the starting materials and amounts in the tables. For preparing the solventless sample labelled Inv. 30, a solution was prepared by mixing the following starting materials in a mixer: 100 g of starting material (A-4) and 400 g of the solution containing 300 g of the staring material (B-1), and solvents were evaporated under reduced pressure at 90° C. for 3 hours. Then, 2.01 g of polyorganohydrogensiloxane (C-1); 0.2 g of hydrosilylation reaction inhibitor (F-1) were added. After mixing of above starting materials, the obtained fluid was further mixed with 4.02 g of hydrosilylation reaction catalyst (D-1) and 12.06 g of photoradical initiator (E-1). Inv. 31 were prepared in the same manner using the starting materials and amounts in the tables.

The compositions had formulations shown below in the following tables. The PSAs prepared from the compositions had the performance results also shown in the following tables. The value in parentheses shows total amount added including polyorganosiloxane and solvent, when the starting material was delivered in solvent. The value without parentheses represents the amount of the polyorganosiloxane starting material excluding solvent. (Tables 2-7 show the starting materials (described in detail in Table 1) and their amounts [based on solids in grams and (solution in grams)] used. The values (solution in grams) indicate that the starting material was first dissolved in solvent and represents the weight in grams of the solution. The values based on solids indicate the amount of the starting material excluding solvent.)

In this Reference Example 10, Adhesive Force was measured before UV irradiation (initial adhesion) as follows. For Comparative Examples (Comp.) 1 to 4 and Working Examples (Inv.) 1 to 33, the silicone (meth)acrylate pressure sensitive adhesive composition was applied onto a polyethylene terephthalate (PET, 75 µm) film for forming a silicone hybrid pressure sensitive adhesive layer which, after curing, had a thickness of 30 µm. A silicone hybrid pressure sensitive adhesive sheet was produced by heating the film for 3 min at 150° C. The obtained sheet was pasted onto a peelable polyethylene terephthalate film by means of a laminator, and the resulting laminate was aged for 1 day at RT. The resulting sheet was cut into tape strips 2.54 cm (1 inch) wide, which were placed on a glass plate and bonded thereto by moving a rubber-lined pressure roller of 2 kg weight on the strip twice back and forth. The assembly was held at room temperature for 1 h. The adhesion force (g/inch) required to peel the tape off from the glass plate by pulling at a speed of 300 mm/min and an angle of 180°.

For Working Examples (Inv.) 34-38, the silicone-(meth) acrylate pressure sensitive adhesive composition was applied onto a peelable polyethylene terephthalate (PET, 75 µm) film for forming a double-sided silicone hybrid pressure sensitive adhesive sheet which, after curing, had a thickness of 50 µm. A silicone hybrid pressure sensitive adhesive sheet was produced by heating the film for 3 min at 150° C. The obtained sheet was pasted onto a peelable PET film by means of a laminator, and the resulting laminate was aged for 1 day at RT. After removing one-side of the peelable polyethylene terephthalate film from the adhesive layer, the adhesive sheet was laminated on the glass substrate (width=25 mm, height=76 mm, thickness=5 mm). After the peelable polyethylene terephthalate film at the opposite side was removed, it was laminated on the other glass to be overlapped by the area of 2.5 cm×2 cm (=5 cm$^2$). After the laminated article was pressured by 2 kg in weight for 30 min, adhesion strength was measured according to a lap shear test method (ASTM D3163).

To measure adhesive force after UV irradiation, the assembly prepared as described above was held at RT for 1 day. Then, the assembly was irradiated with UV light at the condition: Ultraviolet light at a UV illuminance of 0.7 W/cm$^2$ was irradiated from the top surface of the base film with a 365 nm LED lamp (FireJet™ FJ100) for 30 seconds.

Reference Example 11—Transmittance and Haze

The transmittance at 500 nm of the silicone-(meth)acrylate pressure sensitive adhesive sheet cured as described above were measured by the method specified in ASTM D 1003 (UV-Visible Spectrometer, Reference=Air). The haze was measured in the same manner as above by ASTM D 1003-97 (Spectrophotometer, CM-3600A, Reference=75 lam PET).

Reference Example 12—Si-NMR Analysis

Average molecular formulas of the polyorganosiloxane polymers and (meth)acryl-functional polyorganosiloxane resins described above were determined by combing Si-NMR and C-NMR analysis.

NMR apparatus: Fourier Transform Nuclear Magnetic Resonance Spectrometer Bruker 500 MHz AVANCE 3 NMR equipped with 10 mm Si-free probe/5 mm BBFO probe.

Determination method: Integrated values of the peaks were calculated based on signals derived from $^{29}$Si for various siloxane units shown in the table below. D and DR' (where R'=(meth)acryl-functional or other organofunctional group) was calculated by normalizing Si-NMR and C-NMR by using Si-Me numbers. Average molecular formula was identified by finding ratios of the integrated signal values obtained for various siloxane units and then finding siloxane-unit ratios based on the determined signal ratios.

| Siloxane Units | Positions of signal derived from Si-NMR |
|---|---|
| $Me_3SiO_{1/2}$ unit | 20~5 ppm |
| $R'MeSiO_{2/2}$ unit [R' = organo or (meth)acrylic] | −10~−25 ppm |
| $Me_2SiO_{2/2}$ unit | Close to −20 ppm |
| $MASiO_{3/2}$ unit | −60 to −70 ppm |
| $(ZO)SiO_{3/2}$ unit [Z = hydrogen or hydrocarbon] | −95~−107 ppm |
| $SiO_{4/2}$ unit | −107~−120 ppm |

Reference Example 13—Gel Permeation Chromatography

Samples were prepared in toluene at 0.5% w/v concentration, filtered with a 0.45 μm PTFE syringe filter, and analyzed against polystyrene standards. The relative calibration (3rd order fit) used for molecular weight determination was based on 16 polystyrene standards ranging in molecular weights from 580 to 2,610,000 Daltons. The chromatographic equipment consisted of a Waters 2695 Separations Module equipped with a vacuum degasser, a Waters 2414 differential refractometer and two (7.8 mm×300 mm) styragel HR columns (molecular weight separation range of 100 to 4,000,000) preceded by a styrager guard column (4.6×30 mm). The separation was performed using toluene programmed to flow at 1.0 mL/min., injection volume was set at 100 μL and columns and detector were heated to 45° C. Data collection was 60 min and processing was performed using Empower software. As used herein, Mn represents the molecular weight when the peak representing the neopentamer is excluded from the measurement.

TABLE 2

|  | Comp. 1 | Comp. 2 | Comp. 3 | Comp. 4 | Inv. 1 | Inv. 2 | Inv. 3 | Inv. 4 | Inv. 5 | Inv. 6 |
|---|---|---|---|---|---|---|---|---|---|---|
| Starting Materials |  |  |  |  |  |  |  |  |  |  |
| A-1 | 100 (333.33) | 100 (333.33) | 100 (333.33) | 0 | 100 (333.33) | 100 (333.33) | 100 (333.33) | 100 (333.33) | 100 (333.33) | 100 (333.33) |
| A'-5 | 0 | 0 | 0 | 100 (133.33) | 0 | 0 | 0 | 0 | 0 | 0 |
| B-1 | 0 | 0 | 0 | 54.26 (72.35) | 17.75 (23.66) | 17.75 (23.66) | 17.75 (23.66) | 54.26 (72.35) | 101.01 (134.68) | 306.12 (408.16) |
| C-1 | 1.01 | 1.53 | 2.04 | 0.77 | 0.59 | 0 | 0 | 0.77 | 1.01 | 2.04 |
| C-3 | 0 | 0 | 0 | 0 | 0 | 0.43 | 0.25 | 0 | 0 | 0 |
| C-4 | 0 | 0 | 0 | 0 | 0 | 0 | 15.68 | 0 | 0 | 0 |
| D-1 | 2.02 | 3.07 | 4.08 | 1.55 | 1.18 | 1.18 | 1.36 | 1.55 | 2.02 | 4.08 |
| E-1 | 6.06 | 9.23 | 12.24 | 4.65 | 3.55 | 0 | 0 | 4.65 | 6.06 | 12.24 |
| E-2 | 0 | 0 | 0 | 0 | 0 | 0.59 | 0.68 | 0 | 0 | 0 |
| F-1 | 0.16 | 0.16 | 0.16 | 0.12 | 0.05 | 0.04 | 0.05 | 0.16 | 0.16 | 0.16 |
| I-1 | 101.01 (134.68) | 206.15 (274.87) | 306.12 (408.16) | 0 | 0 | 0 | 0 | 0 | 0 | 0 |
| J-1 | 0 | 0 | 0 | 0 | 0 | 0 | 0.60 | 0 | 0 | 0 |
| Calculations |  |  |  |  |  |  |  |  |  |  |
| Total Solid (weight parts, excluding solvent) | 205.94 | 320.17 | 424.66 | 161.36 | 123.14 | 119.98 | 138.50 | 161.41 | 210.27 | 424.66 |
| Total Solution (weight parts, including solvent) | 472.95 | 622.22 | 760.03 | 212.79 | 362.39 | 359.22 | 378.66 | 412.83 | 477.27 | 760.03 |
| % solids | 44% | 51% | 56% | 76% | 34% | 33% | 37% | 39% | 44% | 56% |
| % solvent | 56% | 49% | 44% | 24% | 66% | 67% | 63% | 61% | 56% | 44% |
| Resin/Polymer Ratio | 1.01 | 2.06 | 3.06 | 0.54 | 0.18 | 0.18 | 0.20 | 0.54 | 1.01 | 3.06 |
| SiH/Vi Ratio | 36.30 | 55.28 | 73.33 | 13.76 | 21.26 | 8.2 | 9.4 | 27.85 | 36.30 | 73.33 |
| SiH/Reactive Group Ratio | 36.30 | 55.28 | 73.33 | 0.09 | 0.98 | 0.4 | 0.4 | 0.43 | 0.31 | 0.21 |
| Results |  |  |  |  |  |  |  |  |  |  |
| Initial Adhesion (g/in), before UV irradiation | 59.0 | 952.6 | 2314.7 | 3.5 | 3.0 | 5.7 | 6.7 | 4.3 | 14.0 | 414.2 |
| Subsequent Adhesion (g/in), after UV irradiation | 48.0 | 992.5 | 2092.6 | 2.7 | 4.6 | 631.0 | 758.0 | 553.7 | 444.8 | 812.4 |
| % Increase of Adhesion | −19% | 4% | −10% | −23% | 53% | 10970% | 11213% | 12777% | 3077% | 96% |
| Transmittance (%) @ 550 nm | 90.1 | 90.48 | 90.1 | 90.1 | 90.24 | 90.12 | 89.94 | 89.93 | 90.03 | 89.96 |
| Haze (%) | 0.44 | 0.26 | 0.2 | 0.12 | 0.05 | 0.12 | 0.16 | 0.84 | 0.68 | 0.37 |

Comparative Examples 1-3 are representative examples of conventional silicone pressure sensitive adhesives which demonstrate the use a non-functional (e.g., trimethylated) polyorganosilicate resin gives adhesion property upon Resin/Polymer Ratio. However, their adhesion strength is constant and does not provide the silicone pressure sensitive adhesive prepared from this composition with an increase in adhesion after UV irradiation. In contrast, Working Examples 1-6 show that a silicone (meth)acrylate pressure sensitive adhesive composition as described herein (which contains a both a polydiorganosiloxane polymer with an aliphatically unsaturated groups and a (meth)acryloxylalkyl-functional polyorganosilicate resin) has significantly increased adhesion after UV irradiation, while maintaining good transmittance and haze properties suitable for use in (opto)electronic device applications. Working Examples 1-6 show that as Resin/Polymer Ratio increases from 0.18 to 3.06 with same starting materials in different amounts, the initial adhesion strength increases. And, the subsequent adhesion strength after UV exposure also dramatically increases as compared to the initial adhesion strength in each of Working Examples 1-4.

Comparative Example 4 shows that a curable composition which contains a (meth)acryloxylalkyl functional polydimethylsiloxane polymers and a (meth)acryloxylalkyl-functional polyorganosilicate resin does not have increased adhesion after UV irradiation. When Comparative Example 4 and Example 4 are compared, combination of an aliphatically unsaturated polydiorganosiloxane (polymer without a (meth)acryl functional group) and a (meth)acryloxylalkyl functional polyorganosilicate resin is thought to impart the adhesion increasing behavior after UV irradiation of Example 4, which is not exhibited by Comparative Example 4 under the conditions tested. Without wishing to be bound by theory, it is thought that a photoradically initiated intermolecular reaction between (meth)acryloxylalkyl-functional groups of the polyorganosilicate resins in the linear polydiorganosiloxane chain matrix induces an adhesion increase after UV irradiation.

TABLE 3

|  | Inv. 7 | Inv. 8 | Inv. 9 | Inv. 10 | Inv. 11 | Comp. 4 |
| --- | --- | --- | --- | --- | --- | --- |
| Starting Materials | | | | | | |
| A-2 | 100 (333.33) | 100 (333.33) | 100 (333.33) | 100 (333.33) | 100 (333.33) | 100 (333.33) |
| B-1 | 17.75 (23.66) | 54.26 (72.35) | 101.01 (134.68) | 101.01 (134.68) | 101.01 (134.68) | 101.01 (134.68) |
| C-1 | 0.59 | 0.77 | 1.01 | 1.51 | 2.02 | 8.08 |
| D-1 | 1.18 | 1.55 | 2.02 | 2.02 | 2.02 | 2.02 |
| E-1 | 3.55 | 4.65 | 6.06 | 6.06 | 6.06 | 6.06 |
| F-1 | 0.05 | 0.07 | 0.10 | 0.10 | 0.10 | 0.10 |
| Calculations | | | | | | |
| Total Solid (weight parts, excluding solvent) | 123.14 | 161.32 | 210.20 | 210.71 | 211.21 | 217.27 |
| Total Solution (weight parts, including solvent) | 362.39 | 412.74 | 477.21 | 477.71 | 478.22 | 484.28 |
| % solids | 34% | 39% | 44% | 44% | 44% | 45% |
| % solvent | 66% | 61% | 56% | 56% | 56% | 55% |
| Resin/Polymer Ratio | 0.18 | 0.54 | 1.01 | 1.01 | 1.01 | 1.01 |
| SiH/Vi Ratio | 3.93 | 5.14 | 6.70 | 10.05 | 13.40 | 53.61 |
| SiH/Reactive Group Ratio | 0.81 | 0.41 | 0.29 | 0.44 | 0.59 | 2.36 |
| Results | | | | | | |
| Initial Adhesion (g/in), before UV irradiation | 2.3 | 5.3 | 16.8 | 50.4 | 48.3 | 15.4 |
| Subsequent Adhesion (g/in), after UV irradiation | 4.3 | 173.3 | 1804.8 | 1092.3 | 322.1 | 8.2 |
| % Increase of Adhesion | 87% | 3170% | 10643% | 2067% | 567% | −47% |
| Transmittance (%) @ 550 nm | 90.6 | 90 | 90.02 | 90.03 | 89.8 | 89.76 |
| Haze (%) | 0.1 | 0.47 | 0.48 | 0.62 | 0.82 | 0.85 |

Working Examples 7-9 in Table 3 also show adhesion increasing performance after UV irradiation with different type of polydiorganosiloxane polymer (A-2) as Resin/Polymer Ratio increases. In addition, Working Examples 9-11 show the adhesion increasing property with the same starting materials when SiH/Reactive Group ratio is 0.29, 0.44 and 0.59. In contrast, Comparative Example 4 shows that adhesion strength does not increase after UV irradiation when SiH/Reactive Group Ratio was 2.36 under the conditions tested. Without wishing to be bound by theory, it is thought the SiH/Reactive Group Ratio<2 contributes to the benefit in changing adhesion after UV irradiation by ensuring sufficient reactive groups of (meth)acryloxylalkyl-functional polyorganosilicate resins are present after hydrosilylation cure to allow for further reaction when the silicone meth(acrylate) pressure sensitive adhesive is irradiated with UV irradiation.

TABLE 4

|  | Inv. 12 | Inv. 13 | Inv. 14 | Inv. 15 | Inv. 16 | Inv. 17 |
|---|---|---|---|---|---|---|
| Starting Materials | | | | | | |
| A-2 | 100 (333.33) | 100 (333.33) | 100 (333.33) | 100 (333.33) | 0 | 0 |
| A-3 | 0 | 0 | 0 | 0 | 100 (333.33) | 100 (333.33) |
| A-4 | 0 | 0 | 0 | 0 | 0 | 0 |
| B-1 | 101.01 (134.68) | 101.01 (134.68) | 101.01 (134.68) | 306.12 (408.16) | 101.01 (134.68) | 306.12 (408.16) |
| C-1 | 0 | 0 | 0 | 2.04 | 1.01 | 2.04 |
| C-2 | 1.01 | 1.51 | 2.02 | 0 | 0 | 0 |
| D-1 | 2.02 | 2.02 | 2.02 | 4.08 | 2.02 | 4.08 |
| E-1 | 6.06 | 6.06 | 6.06 | 12.24 | 6.06 | 12.24 |
| F-1 | 0.10 | 0.10 | 0.10 | 0.20 | 0.10 | 0.20 |
| Calculations | | | | | | |
| Total Solid (weight parts, excluding solvent) | 210.20 | 210.71 | 211.21 | 424.69 | 210.20 | 424.69 |
| Total Solution (weight parts, including solvent) | 477.21 | 477.71 | 478.22 | 760.07 | 477.21 | 760.07 |
| % solids | 44% | 44% | 44% | 56% | 44% | 56% |
| % solvent | 56% | 56% | 56% | 44% | 56% | 44% |
| Resin/Polymer Ratio | 1.01 | 1.01 | 1.01 | 3.06 | 1.01 | 3.06 |
| SiH/Vi Ratio | 4.41 | 6.61 | 8.81 | 13.54 | 2.29 | 4.63 |
| SiH/Reactive Group Ratio | 0.19 | 0.29 | 0.39 | 0.20 | 0.27 | 0.20 |
| Results | | | | | | |
| Initial Adhesion (g/in), before UV irradiation | 34.6 | 52.2 | 40.2 | 475.9 | 11.0 | 572.2 |
| Subsequent Adhesion (g/in), after UV irradiation | 1249.8 | 1523.8 | 265.8 | 2174.4 | 88.4 | 2245.4 |
| % Increase of Adhesion | 3512% | 2819% | 561% | 357% | 704% | 292% |

Working Examples 12-17 in Table 4 show that parameters such as Resin/Polymer Ratio and SiH/Reactive Group Ratio also could be proven by using different types of polydiorganosiloxane polymer (A-2 and A-3) and polyorganohydrogensiloxane (C-2).

TABLE 5

| Start Mat'ls | Inv. 18 | Inv. 19 | Inv. 20 | Inv. 21 | Inv. 22 |
|---|---|---|---|---|---|
| A-2 | 100 (333.33) | 100 (333.33) | 100 (333.33) | 100 (333.33) | 100 (333.33) |
| B-2 | 101.01 (134.68) | 306.12 (408.16) | 0 | 0 | 0 |
| B-3 | 0 | 0 | 101.01 (134.68) | 306.12 (408.16) | 0 |
| B-4 | 0 | 0 | 0 | 0 | 101.01 (134.68) |
| B-5 | 0 | 0 | 0 | 0 | 0 |
| B-6 | 0 | 0 | 0 | 0 | 0 |
| C-1 | 4.84 | 9.79 | 1.01 | 2.04 | 1.01 |
| D-1 | 2.02 | 4.08 | 2.02 | 4.08 | 2.02 |
| E-1 | 6.06 | 12.24 | 6.06 | 12.24 | 6.06 |
| F-1 | 0.10 | 0.20 | 0.10 | 0.20 | 0.10 |
| Calculations | | | | | |
| Total Solid (weight parts, excluding solvent) | 214.04 | 432.45 | 210.20 | 424.69 | 210.20 |
| Total Solution (weight parts, including solvent) | 481.04 | 767.82 | 477.21 | 760.07 | 477.21 |
| % solids | 44% | 56% | 44% | 56% | 44% |
| % solvent | 56% | 44% | 56% | 44% | 56% |
| Resin/Polymer Ratio | 1.01 | 3.06 | 1.01 | 3.06 | 1.01 |
| SiH/Vi Ratio | 32.16 | 64.98 | 6.70 | 13.54 | 6.70 |
| SiH/Reactive Group Ratio | 0.70 | 0.47 | 0.52 | 0.36 | 0.25 |

TABLE 5-continued

| Start Mat'ls | Inv. 18 | Inv. 19 | Inv. 20 | Inv. 21 | Inv. 22 |
|---|---|---|---|---|---|
| Results | | | | | |
| Initial Adhesion (g/in), before UV irradiation | 14.3 | 270.8 | 30.6 | 814.4 | 22.9 |
| Subsequent Adhesion (g/in), after UV irradiation | 789.7 | 3200.0 | 108.7 | 1291.1 | 471.8 |
| % Increase of Adhesion | 5422% | 1082% | 255% | 59% | 1960% |

TABLE 6

| Start Mat'ls | Inv. 23 | Inv. 24 | Inv. 25 | Inv. 26 | Inv. 27 |
|---|---|---|---|---|---|
| A-2 | 100 (333.33) | 100 (333.33) | 100 (333.33) | 100 (333.33) | 100 (333.33) |
| B-2 | 0 | 0 | 0 | 0 | 0 |
| B-3 | 0 | 0 | 0 | 0 | 0 |
| B-4 | 306.12 (408.16) | 0 | 0 | 0 | 0 |
| B-5 | 0 | 101.01 | 306.12 | 0 | 0 |
| B-6 | 0 | 0 | 0 | 101.01 | 306.12 |
| C-1 | 2.04 | 4.64 | 9.38 | 1.01 | 2.04 |
| D-1 | 4.08 | 2.02 | 4.08 | 2.02 | 4.08 |
| E-1 | 12.24 | 6.06 | 12.24 | 6.06 | 12.24 |
| F-1 | 0.20 | 0.10 | 0.20 | 0.10 | 0.20 |
| Calculations | | | | | |
| Total Solid (weight parts, excluding solvent) | 424.69 | 213.84 | 432.04 | 210.20 | 424.69 |
| Total Solution (weight parts, including solvent) | 760.07 | 447.17 | 665.37 | 443.54 | 658.03 |
| % solids | 56% | 48% | 65% | 47% | 65% |
| % solvent | 44% | 52% | 35% | 53% | 35% |
| Resin/Polymer Ratio | 3.06 | 1.01 | 3.06 | 1.01 | 3.06 |
| SiH/Vi Ratio | 13.54 | 30.82 | 62.28 | 6.70 | 13.54 |
| SiH/Reactive Group Ratio | 0.17 | 0.67 | 0.45 | 0.31 | 0.21 |
| Results | | | | | |
| Initial Adhesion (g/in), before UV irradiation | 1596.7 | 4.2 | 9.0 | 2.9 | 17.5 |
| Subsequent Adhesion (g/in), after UV irradiation | 3200.0 | 372.7 | 66.4 | 14.0 | 724.7 |
| % Increase of Adhesion | 100% | 8774% | 638% | 383% | 4041% |

TABLE 7

| | Inv. 28 | Inv. 29 | Inv. 30 | Inv. 31 | Inv. 32 | Inv. 33 | Inv. 34 | In. 35 |
|---|---|---|---|---|---|---|---|---|
| Starting Materials | | | | | | | | |
| A-2 | 100 (333.33) | 100 (333.33) | 100 (333.33) | 100 (333.33) | 0 | 0 | 100 (333.33) | 100 (333.33) |
| A-4 | 0 | 0 | 0 | 0 | 100.00 | 100.00 | 0 | 0 |
| B-1 | 0 | 0 | 0 | 0 | 300.00 | 300.00 | 102.04 (136.05) | 105.49 (140.65) |
| B-7 | 101.01 (134.68) | 306.12 (408.16) | 0 | 0 | 0 | 0 | 0 | 0 |
| B-8 | 0 | 0 | 101.01 (134.68) | 306.12 (408.16) | 0 | 0 | 0 | 0 |
| C-1 | 1.01 | 2.04 | 1.01 | 2.04 | 2.01 | 0 | 0 | 0 |
| C-2 | 0 | 0 | 0 | 0 | 0 | 0 | 2.04 | 1.85 |
| C-3 | 0 | 0 | 0 | 0 | 0 | 8.16 | 0 | 0 |
| D-1 | 2.02 | 4.08 | 2.02 | 4.08 | 4.02 | 4.08 | 2.55 | 3.63 |
| E-1 | 6.06 | 12.24 | 6.06 | 12.24 | 12.06 | 12.24 | 7.65 | 10.91 |
| F-1 | 0.10 | 0.20 | 0.10 | 0.20 | 0.20 | 0.20 | 0.12 | 0.18 |
| I-1 | 0 | 0 | 0 | 0 | 0 | 0 | 51.02 (68.02) | 156.42 (208.56) |

TABLE 7-continued

|  | Inv. 28 | Inv. 29 | Inv. 30 | Inv. 31 | Inv. 32 | Inv. 33 | Inv. 34 | In. 35 |
|---|---|---|---|---|---|---|---|---|
| Calculations |  |  |  |  |  |  |  |  |
| Total Solid (weight parts, excluding solvent) | 210.20 | 424.69 | 210.20 | 424.69 | 418.29 | 424.69 | 265.43 | 378.50 |
| Total Solution (weight parts, including solvent) | 477.21 | 760.07 | 477.21 | 760.07 | 418.29 | 424.69 | 481.76 | 490.58 |
| % solids | 44% | 56% | 44% | 56% | 100% | 100% | 55% | 77% |
| % solvent | 56% | 44% | 56% | 44% |  |  | 45% | 23% |
| Resin/Polymer Ratio | 1.01 | 3.06 | 1.01 | 3.06 | 3.00 | 3.00 | 1.53[a] | 2.62[b] |
| SiH/Vi Ratio | 6.70 | 13.54 | 6.70 | 13.54 | 1.97 | 2.16 | 8.90 | 8.09 |
| SiH/Reactive Group Ratio | 0.49 | 0.35 | 0.59 | 0.42 | 0.19 | 0.21 | 0.39 | 0.34 |
| Results |  |  |  |  |  |  |  |  |
| Initial Adhesion (g/in), before UV irradiation | 31.7 | 1131.1 | 4.8 | 37.5 | 177.1 | 19.7 | 8.3 | 1320.6 |
| Subsequent Adhesion (g/in), after UV irradiation | 77.2 | 1374.0 | 6.0 | 1043.4 | 696.2 | 35.0 | 840.1 | 2020.9 |
| % Increase of Adhesion | 144% | 21% | 25% | 2682% | 293% | 78% | 10022% | 53% |
| Transmittance (%) @ 550 nm | 90.2 | 89.97 | 90.25 | 90.1 | 90.07 | 89.71 | 90.2 | 90.1 |
| Haze (%) | 0.47 | 1.38 | 0.01 | 0.81 | 0.93 | 2.32 | 0.3 | 0.27 |

[a] Resin (B-1)/Polymer Ratio = 1.02, Resin (I-1)/Polymer Ratio = 0.51
[b] Resin (B-1)/Polymer Ratio = 1.05, Resin (I-1)/Polymer Ratio = 1.56

Example 18-31 in Table 5, 6 and 7 show that parameters such as Resin/Polymer Ratio and SiH/Reactive Group Ratio also could be proven by using different types of (meth)acryloxyalkyl-functional polyorganosilicate resins (B-2 to B-9). Example 32 and 33 demonstrate it is also possible to prepare solvent-less silicone (meth)acrylate pressure sensitive adhesive composition that cure to form pressure sensitive adhesives with desirable adhesion properties. In addition, Example 34 and 35 demonstrate that the silicone hybrid pressure sensitive adhesive composition may further comprises (I) a non-functional polyorganosilicate resin.

TABLE 8

| Starting Materials | Inv. 36 | Inv. 37 | Inv. 38 | Inv. 39 | Inv. 40 |
|---|---|---|---|---|---|
| A-1 | 100 (333.33) | 100 (333.33) | 0 | 0 | 0 |
| A-2 | 0 | 0 | 100 (333.33) | 100 (333.33) | 100 (333.33) |
| B-1 | 306.12 (408.16) | 410.25 (547) | 306.12 (408.16) | 947.36 (1263.15) | 2111.11 (2814.81) |
| C-1 | 2.04 | 2.56 | 2.04 | 5.26 | 11.11 |
| D-1 | 4.08 | 5.12 | 4.08 | 10.52 | 22.22 |
| E-1 | 12.24 | 15.38 | 12.24 | 31.57 | 66.66 |
| F-1 | 0.16 | 0.15 | 0.20 | 0.52 | 1.11 |
| Calculations |  |  |  |  |  |
| Total Solid (weight parts, excluding solvent) | 424.65 | 533.49 | 424.69 | 1095.26 | 2312.22 |
| Total Solution (weight parts, including solvent) | 760.03 | 903.57 | 760.07 | 1644.39 | 3249.26 |
| % solids | 56% | 59% | 56% | 67% | 71% |
| % solvent | 44% | 41% | 44% | 33% | 29% |
| Resin/Polymer Ratio | 3.06 | 4.10 | 3.06 | 9.47 | 21.11 |
| SiH/Vi Ratio | 73.33 | 92.13 | 13.54 | 34.91 | 73.71 |
| SiH/Reactive Group Ratio | 0.21 | 0.19 | 0.20 | 0.17 | 0.16 |
| Results |  |  |  |  |  |
| Initial Adhesion (kgf/cm$^2$) | 1.4 | 1.0 | 0.5 | 0.6 | 1.1 |
| Subsequent Adhesion (kgf/cm$^2$) | 11.1 | 7.4 | 7.0 | 9.4 | 7.1 |
| % Increase of Adhesion | 720% | 634% | 1445% | 1448% | 525% |

Working Examples 36-40 in Table 8 show that the silicone (meth)acrylate pressure sensitive adhesive composition can be used to prepare a double-sided adhesive sheet. As shown in Working Examples 36-40 in Table 8, the adhesion strength of the assembled specimen highly increases after UV irradiation with different Resin/Polymer Ratios, up to 21.11/1. Although the upper limit of Resin/Polymer Ratio may be not critically limited, without wishing to be bound by theory, it is thought that a Resin/Polymer Ratio that is too high (e.g., >22) may cause cracking of the adhesive sheet depending on the structure of the polyorganosilicate resin and its amount. Therefore, without wishing to be bound by theory, it is thought the Resin/Polymer Ratio<22/1 contributes to the benefit in forming the silicone hybrid pressure sensitive adhesive properly.

Definitions and Usage of Terms

The SUMMARY and ABSTRACT are hereby incorporated by reference. All amounts, ratios, and percentages are by weight unless otherwise indicated by the context of the specification. The articles 'a', 'an', and 'the' each refer to one or more, unless otherwise indicated by the context of the specification. The transitional phrases "comprising", "consisting essentially of", and "consisting of" are used as described in the Manual of Patent Examining Procedure Ninth Edition, Revision 08.2017, Last Revised January 2018 at section § 2111.03 I., II., and III. The abbreviations used herein have the definitions in Table 9.

TABLE 9

Abbreviations Used Herein

| Abbreviation | Definition |
|---|---|
| ° C. | Degrees Celsius |
| cm | centimeters |
| D | A difunctional siloxane unit of formula $R_2SiO_{2/2}$, where each R is independently selected from the group consisting of a monovalent hydrocarbon group and a monovalent halogenated hydrocarbon group |
| $D^{MA}$ | A difunctional siloxane unit of formula $(CH_3)(MA)SiO_{2/2}$ |
| $D^{Me}$ | A difunctional siloxane unit of formula $(CH_3)_2SiO_{2/2}$ |
| $D^{Vi}$ | A difunctional siloxane unit of formula $(CH_3)(CH_2=CH)SiO_{2/2}$ |
| g | grams |
| GPC | Gel permeation chromatography |
| h | hours |
| kg | kilograms |
| kgf | kilograms force |
| M | A monofunctional siloxane unit of formula $R_3SiO_{1/2}$, where each R is independently selected from the group consisting of a monovalent hydrocarbon group and a monovalent halogenated hydrocarbon group |
| $M^{MA}$ | A monofunctional siloxane unit of formula $(CH_3)_2(MA)SiO_{1/2}$ |
| $M^{Me}$ | A monofunctional siloxane unit of formula $(CH_3)_3SiO_{1/2}$ |
| $M^{Vi}$ | A monofunctional siloxane unit of formula $(CH_3)_2(CH_2=CH)SiO_{1/2}$ |
| MA | A methacryloxypropyl group |
| Me | methyl |
| mg | milligrams |
| MHz | megahertz |
| min | minutes |
| mm | millimeters |
| Mn | Number average molecular weight |
| Mw | Weight average molecular weight |
| N | normal |
| nm | nanometers |
| NMR | Nuclear Magnetic Resonance |
| PET | polyethyleneterephthalate |
| PTFE | polytetrafluoroethylene |
| Ph | phenyl |
| ppm | parts per million |
| Q | A quadrifunctional siloxane unit of formula $SiO_{4/2}$ |
| RT | Room temperature of 25 ± 5° C. |
| T | A trifunctional siloxane unit of formula $RSiO_{3/2}$, where R is selected from the group consisting of a monovalent hydrocarbon group and a monovalent halogenated hydrocarbon group |
| $T^{MA}$ | A trifunctional siloxane unit of formula $MASiO_{3/2}$, where MA is a methacryl group |
| $T^{Me}$ | A trifunctional siloxane unit of formula $H_3CSiO_{3/2}$ |
| uL or μL | microliters |
| um or μm | micrometers |
| UV | ultra-violet |
| Vi | A vinyl group |

The invention claimed is:

1. A method for improving the fabrication of an (opto) electronic device comprising: forming a protective film comprising a pressure sensitive adhesive layer on a surface of a substrate, by a method comprising:
   1) optionally treating the surface of the substrate;
   2) applying a composition to the surface of the substrate, wherein the composition comprises:
      (A) a linear or substantially linear polydiorganosiloxane polymer having at least two aliphatically unsaturated hydrocarbon groups per molecule comprising unit formula $(R^4_3SiO_{1/2})_m(R^4_2R^3SiO_{1/2})_n(R^4_2SiO_{2/2})_o(R^4R^3SiO_{2/2})_p(R^4SiO_{3/2})_q(R^3SiO_{3/2})_r(SiO_{4/2})_s$, where each $R^4$ is an independently selected monovalent hydrocarbon group that is free of aliphatic unsaturation and each $R^3$ is an independently selected aliphatically unsaturated monovalent hydrocarbon group, subscripts m, n, o, p, q, r, and s represent numbers of each unit and have values such that $0 \leq m$, $0 \leq n$, a quantity $(m+n) \geq 2$; $0 < o < 10,000$, $p \geq 0$, a quantity $(o+p)$ is 100 to 10,000; $0 \leq q \leq 100$, $0 \leq r \leq 100$, and $0 \leq s \leq 100$; with the proviso that if any one or more of subscript q, r, or s is greater than 0, then a ratio $(o+p)/(q+r+s)$ is 50/1 to 10,000/1;

(B) a (meth)acryloxyalkyl-functional polyorganosiloxane resin comprising unit formula $(R^1_3SiO_{1/2})_a(R^1_2R^2SiO_{1/2})_b(R^1R^2SiO_{2/2})_c(R^1_2SiO_{2/2})_d(R^2SiO_{3/2})_e(R^1SiO_{3/2})_f(SiO_{4/2})_g(ZO_{1/2})_h$, where each $R^1$ is an independently selected monovalent hydrocarbon group, each $R^2$ is an independently selected (meth)acryloxyalkyl group, each Z is independently selected from the group consisting of hydrogen and an alkyl group of 1 to 6 carbon atoms, subscripts a, b, c, d, e, f, g, and h represent relative molar amounts of each unit and have values such that subscript $a \geq 0$, subscript $b \geq 0$, subscript $c \geq 0$, subscript $d \geq 0$, subscript $e \geq 0$, subscript $f \geq 0$, subscript $g \geq 0$, subscript $h \geq 0$, and a quantity $(a+b+c+d+e+f+g+h)=100$; with the provisos that $10 \geq (b+c+e) \geq 0.5$ and $99.5 > (f+g) \geq 30$; where starting materials (A) and (B) are present in the composition in amounts sufficient to provide a weight ratio of (B) resin/(A) polymer (resin/polymer ratio) of 0.15/1 to <22/1;

(C) a polyorganohydrogensiloxane comprising unit formula $(R^5_3SiO_{1/2})_t(R^5_2HSiO_{1/2})_u(R^5_2SiO_{2/2})_v(R^5HSiO_{2/2})_w(R^5SiO_{3/2})_x(HSiO_{3/2})_y(SiO_{4/2})_z$, where each $R^5$ is an independently selected monovalent hydrocarbon group, subscripts t, u, v, w, x, y, and z represent numbers of each unit in the formula and have values such that $t \geq 0$, $u \geq 0$, $v \geq 0$, $w \geq 0$, $x \geq 0$, $y \geq 0$, $z \geq 0$, a quantity $(u+w+y) \geq 2$, and $2,000 \geq (t+u+v+w+x+y+z) \geq 3$; where the polyorganohydrogensiloxane is present in an amount sufficient to provide a molar ratio of silicon bonded hydrogen atoms in starting material (C) to reactive groups (SiH/reactive group ratio) of 0.05/1 to 2/1, where the reactive groups are, collectively, the aliphatically unsaturated monovalent hydrocarbon group and the (meth)acryloxyalkyl groups;

(D) a hydrosilylation reaction catalyst in an amount sufficient to provide 1 ppm to 1,000 ppm of a platinum group metal based on combined weights of starting materials (A), (B), (C), (D), (E), and (F) in the composition;

(E) a photoradical initiator in an amount sufficient to provide 0.01 weight % to 10 weight % based on combined weights of starting materials (A), (B), (C), (D), (E), and (F) in the composition;

(F) a hydrosilylation reaction inhibitor in an amount sufficient to provide 5 ppm to 2 weight % based on combined weights of starting materials (A), (B), (C), (D), (E), and (F) in the composition;

optionally (G) a radical scavenger; and optionally (H) a solvent;

3) optionally removing the solvent, if present;

4) curing the composition to form the pressure sensitive adhesive layer on the surface of the substrate, thereby forming the protective film;

5) applying the protective film to the (opto)electronic device such that pressure sensitive adhesive layer contacts a surface in the (opto)electronic device;

6) using the protective film to protect the device; and thereafter 7) exposing the pressure sensitive adhesive layer to actinic radiation.

2. The method of claim 1, where in starting material (A), each aliphatically unsaturated monovalent hydrocarbon group for $R^3$ is an independently selected alkenyl group; and each monovalent hydrocarbon group for $R^4$ is independently selected from the group consisting of alkyl groups and aryl groups, subscript m=0, subscript q=0, subscript r=0, subscript s=0, subscript n=2, and a quantity (n+o+p) is sufficient to provide starting material (A) with vinyl content of 0.01 weight % to 0.5 weight % based on weight of starting material (A).

3. The method of claim 1, where in starting material (B), each monovalent hydrocarbon group for $R^1$ is independently selected from the group consisting of alkyl groups and aryl groups, each (meth)acryloxyalkyl functional group for $R^2$ is independently selected from the group consisting of acryloxypropyl and methacryloxypropyl, subscript a is 35 to 55, subscript b=0, subscript c is 1 to 10, subscript d is 0 to 20, subscript e is 0 to 5, subscript f is 0 to 3, subscript g is 35 to 50, and subscript h is 0 to 1.

4. The method of claim 1, where in starting material (C), each $R^5$ is independently selected from the group consisting of alkyl and aryl groups, subscript t is 0, 1, or 2; subscript u is 0, 1, or 2; a quantity (t+u)=2; subscript $v \geq 0$, subscript $w > 0$, subscript x=0, subscript y=0, subscript z=0; and a quantity (t+u+v+w) is sufficient to provide starting material (C) viscosity of 3 mPa·s to 1,000 mPa·s at 25° C.

5. The method of claim 1, where (D) the hydrosilylation reaction catalyst is selected from the group consisting of: i) a platinum group metal, ii) a compound of said metal, iii) a complex of said metal or said compound, v) the complex microencapsulated in a matrix or coreshell type structure.

6. The method of claim 1, where (E) the photoradical initiator is selected from the group consisting of photoradical initiator may be selected from the group consisting of Ei) benzophenone, Eii) a substituted benzophenone compound, Eiii) acetophenone, Eiv) a substituted acetophenone compound, Ev) benzoin, Evi) an alkyl ester of benzoin, Evii) a substituted phosphine oxide compound, Eviii) xanthone, and Eix) a substituted xanthone; and Ex) a substituted oxime ester compound, and Exi) a combination of two or more of Ei) to Ex).

7. The method of claim 1, where the composition further comprises (F) a hydrosilylation reaction inhibitor, and the hydrosilylation reaction inhibitor is selected from the group consisting of acetylenic alcohols, cycloalkenylsiloxanes, ene-yne compounds, triazoles, phosphines, mercaptans, hydrazines, amines, fumarates, maleates, nitriles, ethers, carbon monoxide, alcohols, and silylated acetylenic alcohols.

8. The method of claim 1, where the composition further comprises (G) a radical scavenger, and the radical scavenger is selected from the group consisting of a phenolic compound, phenothiazine and an anaerobic inhibitor.

9. The method of claim 1, where the composition further comprises (H) a solvent, where the solvent is present and is selected from the group consisting of an aliphatic hydrocarbon and an aromatic hydrocarbon.

10. The method of claim 1, where the composition further comprises (I) a non-functional polyorganosilicate resin.

11. The method of claim 1, where resin/polymer ratio is 0.2/1 to 9/1.

12. The method of claim 1, where SiH/reactive group ratio is 0.1/1 to 0.9/1.

* * * * *